(12) United States Patent
Tanaka

(10) Patent No.: US 10,959,337 B2
(45) Date of Patent: Mar. 23, 2021

(54) CONNECTION STRUCTURE

(71) Applicant: Mikuni Electron Corporation, Saitama (JP)

(72) Inventor: Sakae Tanaka, Saitama (JP)

(73) Assignee: MIKUNI ELECTRON CORPORATION, Saitama (JP)

( * ) Notice: Subject to any disclaimer, the term of this patent is extended or adjusted under 35 U.S.C. 154(b) by 0 days.

(21) Appl. No.: 16/807,339

(22) Filed: Mar. 3, 2020

(65) Prior Publication Data

US 2020/0205297 A1 Jun. 25, 2020

Related U.S. Application Data

(63) Continuation of application No. 16/004,295, filed on Jun. 8, 2018, now Pat. No. 10,624,215.

(30) Foreign Application Priority Data

Jan. 31, 2018 (JP) .............................. JP2018-015666

(51) Int. Cl.
   *H05K 3/32* (2006.01)
   *H05K 1/03* (2006.01)
   *H01L 23/00* (2006.01)

(52) U.S. Cl.
   CPC ............. *H05K 3/323* (2013.01); *H01L 24/83* (2013.01); *H05K 1/0306* (2013.01)

(58) Field of Classification Search
   CPC ....... H05K 3/323; H05K 1/0306; H01L 24/83
   USPC ...................................................... 174/250
   See application file for complete search history.

(56) References Cited

U.S. PATENT DOCUMENTS

| | | |
|---|---|---|
| 5,065,505 A | 11/1991 | Matsubara et al. |
| 5,605,999 A | 2/1997 | Chu et al. |
| 6,223,429 B1 | 5/2001 | Kaneda et al. |
| 6,232,563 B1 | 5/2001 | Kim et al. |
| 6,365,840 B1 | 4/2002 | Honda et al. |
| 6,451,875 B1 | 9/2002 | Suga et al. |
| 8,043,709 B2 | 10/2011 | Arifuku et al. |
| 9,331,044 B2 | 5/2016 | Shin et al. |
| 9,994,743 B2 | 6/2018 | Aoki et al. |
| 10,175,544 B2 | 1/2019 | Shinohara |
| 10,176,903 B2 | 1/2019 | Sekitani et al. |
| 2001/0046021 A1 | 11/2001 | Kozuka et al. |

(Continued)

FOREIGN PATENT DOCUMENTS

| | | |
|---|---|---|
| JP | H10-256304 A | 9/1998 |
| JP | 2015-167106 A | 9/2015 |

OTHER PUBLICATIONS

U.S. Office action for U.S. Appl. No. 16/004,281, dated Jan. 2, 2019.

(Continued)

*Primary Examiner* — Tremesha S Willis
(74) *Attorney, Agent, or Firm* — Pearne & Gordon LLP

(57) ABSTRACT

A method for manufacturing connection structure, the method includes arranging a first composite on a first surface of a first member where a first electrode is located and arranging conductive particles on the first electrode, arranging a second composite on a region other than the first electrode of the first surface, arranging the first surface and a second surface of a second member where a second electrode is located, so that the first electrode and the second electrode are opposed to each other, pressing the first member and the second member, and curing the first composite and the second composite.

19 Claims, 13 Drawing Sheets

(56) References Cited

U.S. PATENT DOCUMENTS

| | | |
|---|---|---|
| 2002/0037397 A1 | 3/2002 | Suzuki et al. |
| 2002/0048924 A1 | 4/2002 | Lay et al. |
| 2003/0049425 A1 | 3/2003 | Ono et al. |
| 2003/0146499 A1 | 8/2003 | Kondo et al. |
| 2004/0108133 A1 | 6/2004 | Sano et al. |
| 2004/0217342 A1 | 11/2004 | Kokubo et al. |
| 2004/0224441 A1 | 11/2004 | Saito |
| 2005/0151271 A1 | 7/2005 | Tatsuzawa et al. |
| 2005/0155706 A1 | 7/2005 | Nishida et al. |
| 2005/0173701 A1 | 8/2005 | Kawase et al. |
| 2005/0176882 A1 | 8/2005 | Arifuku et al. |
| 2005/0184389 A1 | 8/2005 | Chen et al. |
| 2005/0211464 A1 | 9/2005 | Byun et al. |
| 2006/0033213 A1 | 2/2006 | Yim et al. |
| 2006/0132697 A1 | 6/2006 | Ueshima |
| 2006/0160383 A1 | 7/2006 | Yamada et al. |
| 2006/0244893 A1 | 11/2006 | Oda |
| 2006/0249301 A1 | 11/2006 | Meth |
| 2007/0045841 A1 | 3/2007 | Cho et al. |
| 2007/0054984 A1 | 3/2007 | Jun et al. |
| 2007/0216023 A1 | 9/2007 | Nakatani et al. |
| 2007/0252112 A1 | 11/2007 | Jun et al. |
| 2007/0295943 A1 | 12/2007 | Jun et al. |
| 2008/0145607 A1 | 6/2008 | Kajiwara et al. |
| 2008/0185717 A1 | 8/2008 | Sasaki |
| 2008/0194762 A1 | 8/2008 | Sugasaki |
| 2008/0231789 A1 | 9/2008 | Kurasawa |
| 2008/0245248 A1 | 10/2008 | Takamatsu |
| 2009/0026612 A1 | 1/2009 | Kang |
| 2009/0115071 A1 | 5/2009 | Karashima et al. |
| 2009/0117687 A1 | 5/2009 | Hashimoto |
| 2009/0126975 A1 | 5/2009 | Kondo |
| 2009/0141438 A1 | 6/2009 | Aita et al. |
| 2009/0189254 A1 | 7/2009 | Kaneya et al. |
| 2009/0239082 A1 | 9/2009 | Fujita |
| 2009/0294046 A1 | 12/2009 | Sim et al. |
| 2009/0309220 A1 | 12/2009 | Katogi et al. |
| 2010/0001411 A1 | 1/2010 | Sawada et al. |
| 2010/0012358 A1 | 1/2010 | Tatsuzawa et al. |
| 2010/0038023 A1 | 2/2010 | Kho et al. |
| 2010/0060841 A1 | 3/2010 | Shinn et al. |
| 2010/0085720 A1 | 4/2010 | Shudo |
| 2010/0133486 A1 | 6/2010 | Takai et al. |
| 2010/0142359 A1 | 6/2010 | Sakata et al. |
| 2010/0163289 A1 | 7/2010 | Ito et al. |
| 2010/0178487 A1 | 7/2010 | Arai et al. |
| 2010/0319974 A1 | 12/2010 | Ishizuka |
| 2010/0327237 A1 | 12/2010 | Takai et al. |
| 2010/0327737 A1 | 12/2010 | Hayashi et al. |
| 2011/0155430 A1 | 6/2011 | Lee et al. |
| 2011/0176288 A1 | 7/2011 | Katogi et al. |
| 2011/0311790 A1 | 12/2011 | Okada et al. |
| 2012/0048606 A1 | 3/2012 | Izawa et al. |
| 2012/0049340 A1 | 3/2012 | Tsurume et al. |
| 2012/0085579 A1 | 4/2012 | Tatsuzawa et al. |
| 2012/0127660 A1 | 5/2012 | Lee et al. |
| 2012/0183781 A1 | 7/2012 | Chuma et al. |
| 2012/0214010 A1 | 8/2012 | Kagimoto et al. |
| 2012/0247818 A1 | 10/2012 | Adachi et al. |
| 2012/0261174 A1 | 10/2012 | Chuma et al. |
| 2013/0134570 A1 | 5/2013 | Nishido |
| 2013/0335940 A1 | 12/2013 | Matsui et al. |
| 2014/0026646 A1 | 1/2014 | Feldman et al. |
| 2014/0217450 A1 | 8/2014 | Ishigami et al. |
| 2014/0341242 A1 | 11/2014 | Murayama et al. |
| 2014/0371330 A1 | 12/2014 | Hayashi et al. |
| 2015/0114454 A1 | 4/2015 | Kim et al. |
| 2015/0155405 A1 | 6/2015 | Jang |
| 2015/0197672 A1 | 7/2015 | Namiki et al. |
| 2015/0208511 A1 | 7/2015 | Ishimatsu |
| 2015/0209914 A1 | 7/2015 | Ishigami et al. |
| 2015/0236230 A1 | 8/2015 | Miyata |
| 2015/0240130 A1 | 8/2015 | Liang et al. |
| 2015/0318257 A1 | 11/2015 | Kim et al. |
| 2015/0353781 A1 | 12/2015 | Namiki et al. |
| 2016/0027860 A1 | 1/2016 | Yamamoto |
| 2016/0155717 A1 | 6/2016 | Saruyama et al. |
| 2016/0177038 A1 | 6/2016 | Hori et al. |
| 2016/0286649 A1 | 9/2016 | Choi |
| 2016/0306213 A1 | 10/2016 | Lee |
| 2016/0327826 A1 | 11/2016 | Shinohara |
| 2016/0329295 A1 | 11/2016 | Yamaguchi et al. |
| 2017/0115591 A1 | 4/2017 | Terada et al. |
| 2017/0121571 A1 | 5/2017 | Namiki et al. |
| 2017/0168198 A1 | 6/2017 | Kajiya |
| 2017/0169914 A1 | 6/2017 | Sekitani et al. |
| 2017/0336710 A1 | 11/2017 | Baron et al. |
| 2018/0026012 A1 | 1/2018 | Akutsu et al. |
| 2018/0044558 A1 | 2/2018 | Shinohara |
| 2018/0063956 A1 | 3/2018 | Min et al. |
| 2018/0086950 A1 | 3/2018 | Kunimune et al. |
| 2018/0177045 A1 | 6/2018 | Schwarz et al. |
| 2018/0197657 A1 | 7/2018 | Tsukao et al. |
| 2019/0150295 A1 | 5/2019 | Gavagnin et al. |
| 2019/0276709 A1 | 9/2019 | Tsukao et al. |

OTHER PUBLICATIONS

U.S. Office action for U.S. Appl. No. 16/004,281, dated Apr. 12, 2019.
U.S. Office action for U.S. Appl. No. 16/004,302, dated Mar. 8, 2019.
U.S. Office action for U.S. Appl. No. 16/004,295, dated Jan. 17, 2019.
U.S. Office Action for U.S. Appl. No. 16/004,295, dated Aug. 21, 2019.
U.S. Office Action for U.S. Appl. No. 16/695,592, dated Dec. 31, 2019.
U.S. Office action for U.S. Appl. No. 16/927,640, dated Aug. 20, 2020.
U.S. Office action for U.S. Appl. No. 16/720,242, dated Aug. 24, 2020.
U.S. Office action for U.S. Appl. No. 16/720,242, dated Nov. 25, 2020.
Final Office Action dated Feb. 9, 2021 for the U.S. Appl. No. 16/927,640.

FIG. 10A
FIG. 10B
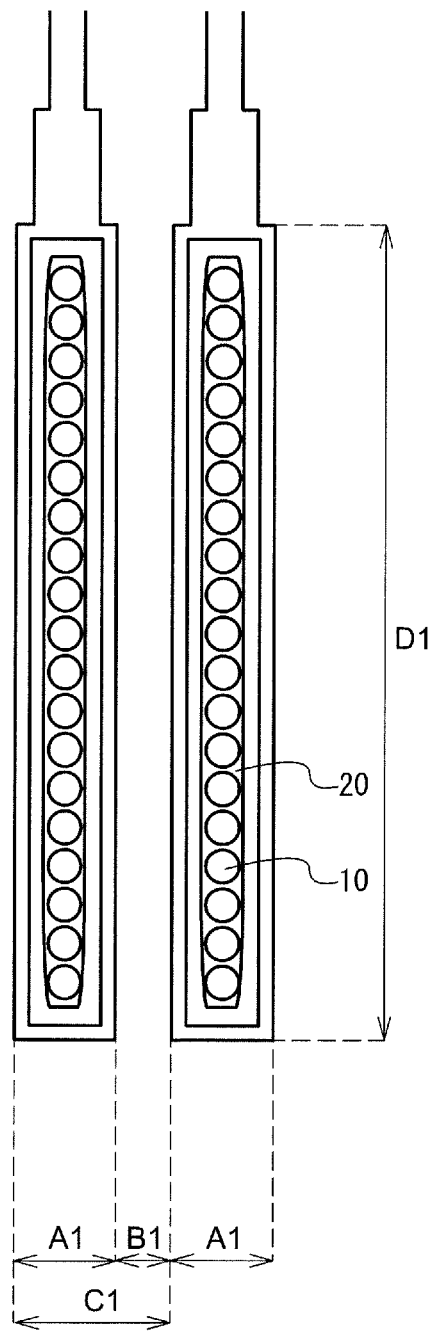
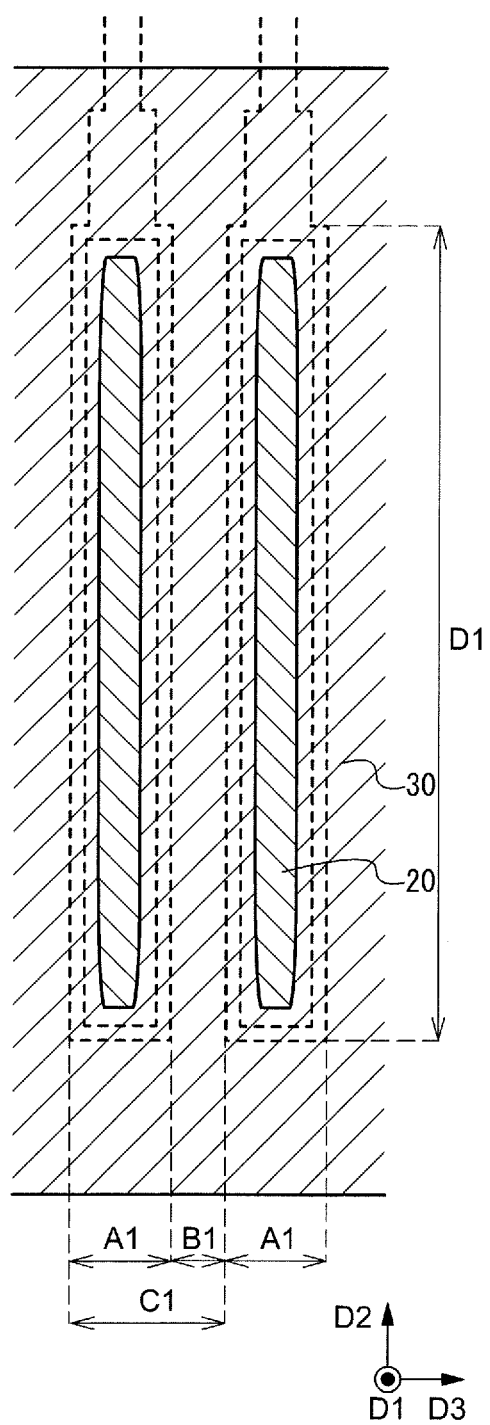

FIG. 11A
FIG. 11B
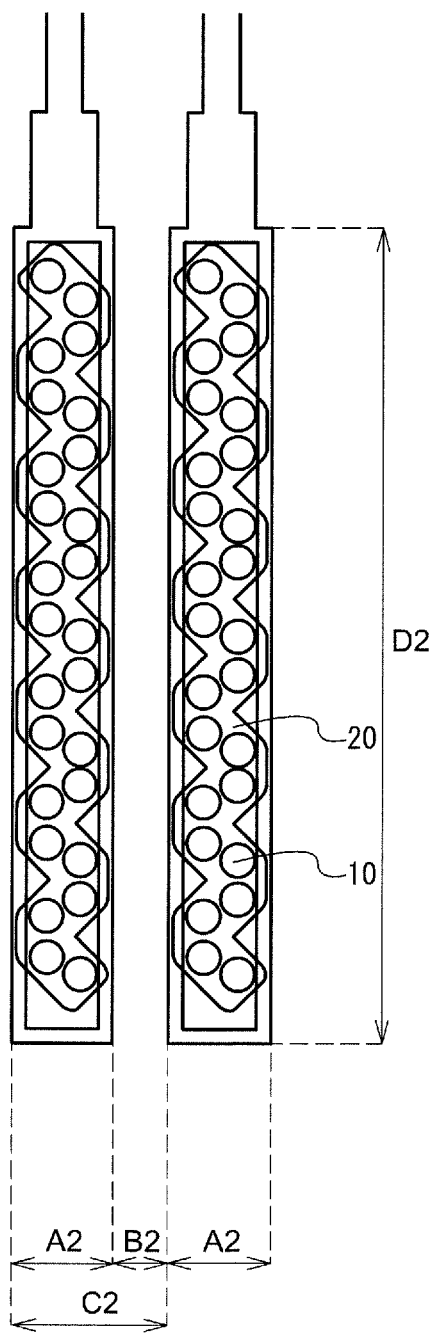
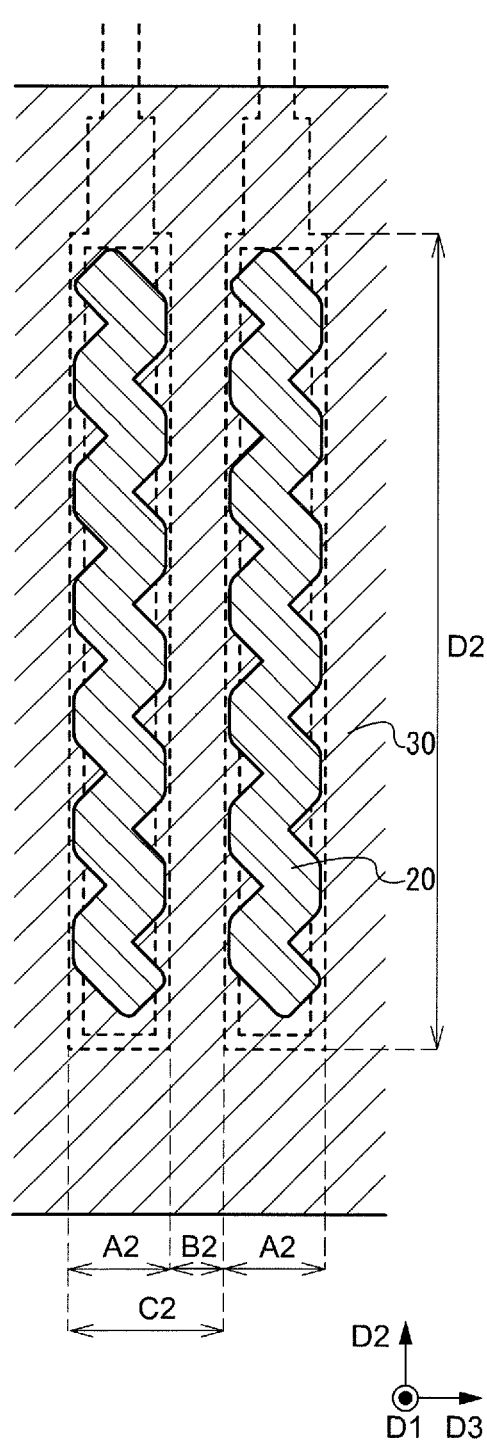

CONNECTION STRUCTURE

CROSS-REFERENCE TO RELATED APPLICATIONS

This is a continuation of U.S. patent application Ser. No. 16/004,295 filed on Jun. 8, 2018, which claims the benefit of priority from the prior Japanese Patent Application No. 2018-015666, filed on Jan. 31, 2018, the entire contents of which are incorporated herein by reference.

FIELD

An embodiment of the present invention relates to a connection structure having a connection configuration of electrodes made of conductive composite and a method for manufacturing the connection structure.

BACKGROUND

In general, an anisotropic conductive films (ACF) containing conductive particles is widely used when an electronic component such as an integrated circuit is mounted on a substrate in COG (Chip on Glass) connection for connecting an integrated circuit directly to a glass substrate such as a liquid-crystal display or FOG (Film on Glass) connection for connecting a flexible printed board to a glass substrate of a flat panel display. The anisotropic conductive film is a thermosetting resin film with fine conductive particles dispersed therein. By interposing the anisotropic conductive film between aligned electrodes and performing thermal compression, the conductive particles positioned between the electrodes can form a conductive route. On the other hand, insulation properties of the thermosetting resin can reduce a short circuit between electrodes adjacent in a substrate surface direction. That is, the anisotropic conductive film has anisotropy of forming conductivity in a pressurizing direction (direction of both of the electrodes) and insulation properties are kept in a non-pressurizing direction (surface direction of the substrate). Having these characteristic, the anisotropic conductive film can collectively connect a plurality of electrodes provided on an integrated circuit, printed board, glass substrate, or the like, and can retain insulation properties of adjacent electrodes in the substrate surface direction.

However, with high fineness and high density of connection circuits in electronic devices in recent years, reliability of connection using the anisotropic conductive film matters. That is, when the size of an electrode as a connection target decreases, the number of conductive particles contributing to conductivity between paired electrodes decreases, and connection reliability between the electrodes may not be sufficiently obtained. Moreover, when a space between electrodes adjacent in the substrate surface direction is narrowed, both of the adjacent electrodes and the conductive particles may be in contact with each other, and insulation reliability may not be sufficiently obtained. Thus, for example, an anisotropic conductive film in a state with conductive particles dispersed by means such as application of a magnetic field and as being separated from other conductive particles is disclosed (for example, refer to Japanese Unexamined Patent Application Publication No. 2015-167106).

SUMMARY

A method for manufacturing connection structure according to an embodiment of the present invention, the method includes arranging a first composite on a first surface of a first member where a first electrode is located and arranging conductive particles on the first electrode, arranging a second composite on a region other than the first electrode of the first surface, arranging the first surface and a second surface of a second member where a second electrode is located, so that the first electrode and the second electrode are opposed to each other, pressing the first member and the second member, and curing the first composite and the second composite.

A method for manufacturing connection structure according to another embodiment of the present invention, the method includes arranging a second composite on a region other than a first electrode located on a first surface of a first member, arranging a first composite on the first surface and arranging conductive particles on the first electrode, arranging the first surface and a second surface of a second member where a second electrode is located, so that the first electrode and the second electrode are opposed to each other, pressing the first member and the second member, and curing the first composite and the second composite.

A connection structure according to an embodiment of the present invention includes a first member having a first surface, a first electrode located on the first surface, a second member having a second surface opposed to the first surface, a second electrode opposed to the first electrode and located on the second surface, conductive particles arranged between the first electrode and the second electrode, a first resin arranged between the first electrode and the second electrode and between a region other than the first electrode on the first surface and a region other than the second electrode on the second surface, and a second resin arranged between a region other than the first electrode on the first surface and a region other than the second electrode on the second surface. The first resin is in contact with the first surface, the second resin is in contact with the second surface, and the first resin and the second resin is different compositions from each other.

BRIEF DESCRIPTION OF DRAWINGS

FIG. 10A and FIG. 10B shows an example of the connection structure according to an embodiment of the present invention;

FIG. 11A and FIG. 11B shows an example of the connection structure according to an embodiment of the present invention;

DESCRIPTION OF EMBODIMENTS

Figure 1A:
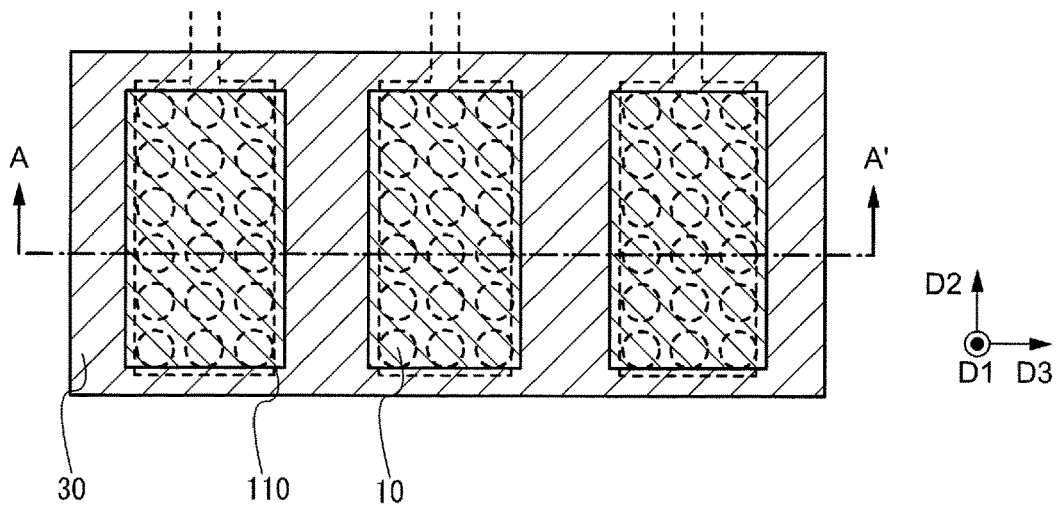
FIG. 1A to FIG. 1E shows a configuration of a connection structure according to an embodiment of the present invention.

Hereinafter, embodiments of the present invention will be described with reference to the drawings and the like. The present invention may be carried out in various embodiments, and should not be construed as being limited to any of the following embodiments. In the drawings, components may be shown schematically regarding the width, thickness, shape and the like, instead of being shown in accordance with the actual sizes, for the sake of clear illustration. The drawings are merely examples and do not limit the present invention in any way. In the specification and the drawings, components that are substantially the same as those described or shown previously bear the identical reference signs thereto (or the identical reference signs followed by letters "a", "b" or the like), and detailed descriptions thereof may be omitted. The terms "first", "second" and the like used for elements are merely provided for distinguishing the elements and do not have any other significance unless otherwise specified.

In the specification and the claims, an expression that a component is "on" the other component encompasses a case where such a component is in contact with the other component and also a case where such a component is above or below the other component, namely, a case where still another component is provided between such a component and the another component, unless otherwise specified.

In the anisotropic conductive film, since the sequence of the conductive particles is irregularly disturbed when substrates are subjected to thermal compression. Thus, it is difficult to sufficiently solve problems such as conduction failure due to the absence of conductive particles between the electrodes and a short circuit due to a contact of the conductive particles between the adjacent electrodes. Moreover, with a heat curing connection scheme, a dimensional change occurs in principle, due to a difference in coefficient of thermal expansion between upper and lower substrates, and a problem of deviation occurs between the electrodes formed on the upper and lower substrates. In several embodiments described further below, one aspect of a connection structure capable of solving one or plurality of these problems is described.

In the specification, a connection structure in COG connection for connecting an integrated circuit (second electronic component) to a glass substrate of a liquid-crystal display (a first electronic component) is described by way of example. However, the connection structure is not limited to this, and may be a connection structure in FOG connection for connecting a flexible printed board to a glass substrate of a flat panel display. In this case, the second electronic component may be a flexible printed board such as a TAB (Tape Automated Bonding) or COF (Chip on film).

First Embodiment

Configuration of Connection Structure

Figure 1B:
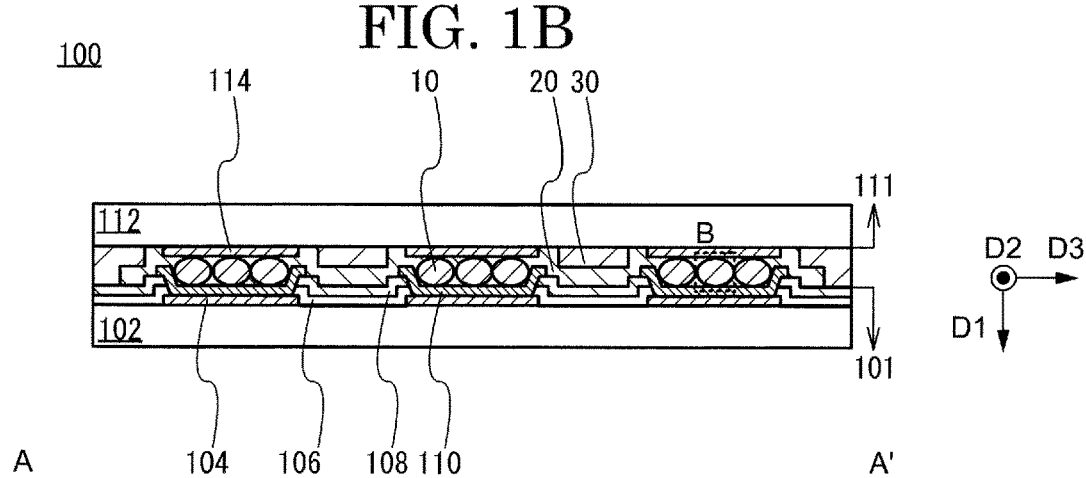
Figure 1C:
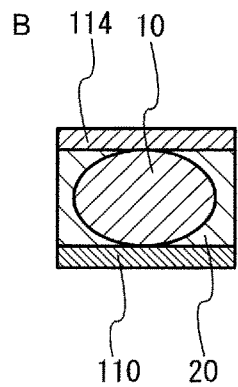

FIG. 1A to FIG. 1C shows the configuration of a connection structure according to one embodiment of the present invention. FIG. 1A is a plan view of the connection structure according to one embodiment of the present invention. FIG. 1B is a sectional view along an A-A' line of FIG. 1A. FIG. 1C is an enlarged sectional view of a conductive particle in a region B of FIG. 1B.

As shown in FIG. 1A and FIG. 1B, a first electronic component 101 includes a terminal 104, a first insulating film 106, a second insulating film 108, and a first electrode 110 on a connection surface (first surface) of a first member 102. On the connection surface (first surface) of the first electronic component 101, a second electronic component 111 is mounted. The second electronic component 111 includes a second electrode 114 on a connection surface (second surface) of a second member 112. The first surface of the first electronic component 101 and the second surface of the second electronic component 111 are arranged so as to be opposed to each other. The connection structure 100 serves a function of physical connection between the first electronic component 101 and the second electronic component 111 and electrical connection between the first electrode 110 and the second electrode 114. The connection structure 100 includes the first member 102 having the first surface, the first electrode 110, the second member 112 having the second surface, the second electrode 114, conductive particles 10, a first resin 20, and a second resin 30.

A plurality of first electrodes 110 are arranged on the first surface of the first member 102. On the first surface of the first member 102, a second insulating film 108 is arranged in a region other than a region where the first electrodes 110 are arranged. A plurality of second electrodes 114 are arranged on the second surface of the second member 112 so as to correspond to the plurality of first electrodes 110. On the second surface of the second member 112, an insulating film may be arranged in a region other than a region where the second electrodes 114 are arranged.

The plurality of first electrodes 110 and the plurality of second electrodes 114 are arranged so as to be the first electrode 110 and the second electrode 114 are opposed to each other. The plurality of conductive particles 10 and the first resin 20 are arranged between the opposing first electrode 110 and second electrode 114. The plurality of conductive particles 10 are arranged in a surface direction (D2-D3 surface direction) between the opposing first electrode 110 and second electrode 114. One conductive particle 10 is arranged between the opposing first electrode 110 and second electrode 114 in an opposing direction (D1 direction) of the first electrode 110 and the second electrode 114. Each of the plurality of conductive particles 10 are in contact with the opposing first electrode 110 and second electrode 114. As shown in FIG. 1C, the conductive particle 10 is pressured and deformed in the opposing direction (D1 direction) between the first electrode 110 and the second electrode 114 by a method for manufacturing connection structure, which will be described further below. That is, a distance between the first electrode 110 and the second electrode 114 in the opposing direction (D1 direction) of the electrodes is substantially equal to the height of the conductive particle 10 in the opposing direction (D1 direction) of the electrodes. The height of the conductive particle 10 in the opposing direction (D1 direction) of the electrodes is pressured and deformed by approximately 10% to 40%. With a stress provided among the first electrode 110, the conductive particles 10, and the second electrode 114, the first resin 20 is eliminated at the contact part between the first electrode 110 and the conductive particle 10 and the contact part between the second electrode 114 and the conductive particle 10. Furthermore, even if a natural oxide film is formed on the first electrode 110, the conductive particle 10, or the second electrode 114 and its surface is insulated, the first electrode 110 and the second electrode 114 are pressure-welded with the conductive particle 10 interposed therebetween, thereby breaking the natural oxide film to form a conductive route. Furthermore, deformation of the conductive particle 10 can increase the area of contact between the first electrode 110 and the conductive particle 10 and the area of contact between the second electrode 114 and the conductive particle 10. This arrangement allows the conductive particle 10 to electrically connect the first electrode 110 and the second electrode 114.

The plurality of conductive particles 10 are dispersed in the first resin 20 between the first electrode 110 and the second electrode 114. Each of the plurality of conductive particles 10 are surrounded by the first resin 20 between the first electrode 110 and the second electrode 114 in the surface direction (D2-D3 surface direction). The first resin 20 is an insulating resin. Thus, the connection structure 100 has insulation properties in the surface direction (D2-D3 surface direction). However, the plurality of conductive particles 10 arranged between the opposing first electrode 110 and second electrode 114 and adjacent to each other in the surface direction (D2-D3 surface direction) may be in contact with each other. When the conductive particles 10 adjacent to each other in the surface direction (D2-D3 surface direction) are in contact with each other, the conductive particles 10 adjacent to each other are also electrically connected. This arrangement allows the conductive particles 10 to further reliably connect the opposing first electrode 110 and second electrode 114 electrically. The distance between the adjacent conductive particles 10 can be appropriately controlled according to the concentration of the conductive particles 10 mixed into a first composite 20', which will be described further below.

As shown in FIG. 1A and FIG. 1B, the plurality of conductive particles 10 and the first resin 20 are arranged between the first electrode 110 and the second electrode 114. In the present embodiment, the plurality of conductive particles 10 and the first resin 20 are arranged on a substantially entire upper surface of the first electrode 110 (or bottom surface of the second electrode 114) when viewed in the opposing direction (D1 direction) of the electrodes. The diameter of the conductive particle 10 when viewed in the opposing direction (D1 direction) of the electrodes is in a range between a value equal to or larger than 2 μm and a value equal to or smaller than 10 μm. When viewed in the opposing direction (D1 direction) of the electrodes, the number of conductive particles 10 arranged between the opposing first electrode 110 and second electrode 114 is preferably in a range between a value equal to or larger than seven per 400 $\mu m^2$ and a value equal to or smaller than twenty per 400 $\mu m^2$. When the number of conductive particles 10 is smaller than seven per 400 $\mu m^2$, the connection resistance value may tend to vary. When the number of conductive particles 10 is larger than twenty per 400 $\mu m^2$, the pressure deformation amount of the conductive particles 10 may be decreased due to load dispersion, causing the natural oxide film to be unable to be broken at a connection region and increasing connection resistance. Furthermore, when the number of conductive particles 10 is larger than twenty per 400 $\mu m^2$, the pressure deformation amount tends to change with time, and connection resistance tends to change with time. The above-described arrangement allows the conductive particles 10 to reliably connect the opposing first electrode 110 and second electrode 114, and can prevent a short circuit between the plurality of first electrodes 110 adjacent to each other in the surface direction (D2-D3 surface direction), between the plurality of second electrodes 114 adjacent to each other in the surface direction (D2-D3 surface direction), and between the first electrode 110 and the second electrode 114 not opposed to each other.

In the present embodiment, the shape of the region where the conductive particles 10 and the first resin 20 are arranged when viewed in the opposing direction (D1 direction) of the electrodes is a rectangle so as to match the first electrode 110 (or the second electrode 114). However, the shape is not limited to this, and the region where the conductive particles 10 and the first resin 20 are arranged may have any shape having an area within the above-described range.

The area of the region arranged on the upper surface of one first electrode 110 (or the bottom surface of one second electrode 114) where the conductive particles 10 and the first resin 20 are arranged can be adjusted as appropriate to satisfy the above-described condition, depending on the area of the first electrode 110 (or the second electrode 114), the size of the conductive particles 10, and so forth. The number of conductive particles 10 arranged in the region where the conductive particles 10 and the first resin 20 are arranged can be adjusted as appropriate to satisfy the above-described condition, depending on the size of the conductive particles 10 and the concentration of the conductive particles 10 mixed into the first composite 20', which will be described further below.

In the present embodiment, the first resin 20 is arranged also in a region other than the first electrode 110 of the first surface when viewed in the opposing direction (D1 direction) of the electrodes. The first resin 20 is arranged also between the plurality of first electrodes 110 and around the plurality of first electrodes 110 on the first surface when viewed in the opposing direction (D1 direction) of the electrodes. On the other hand, the first resin 20 is not arranged at an end of the first surface when viewed in the opposing direction (D1 direction) of the electrodes. Here, the conductive particles 10 are not arranged in a region other than the first electrode 110 of the first surface (the second electrode 114 of the second surface) when viewed in the opposing direction (D1 direction) of the electrodes. That is, the conductive particles 10 are arranged on the first electrode 110 (or the second electrode 114).

The second resin 30 is further arranged between the first surface of the first member 102 and the second surface of the second member 112. The second resin 30 is arranged in a region not between the opposing first electrode 110 and second electrode 114. In the present embodiment, the second resin 30 is arranged in a region other than the second electrode 114 of the second surface when viewed in the opposing direction (D1 direction) of the electrodes. That is, the second resin 30 is arranged on the second surface of the second member 112 between the plurality of second electrodes 114 adjacent to each other in the surface direction (D2-D3 surface direction) and on the periphery thereof. The conductive particles 10 and the first resin 20 arranged on the second electrode 114 on the second surface of the second member 112 are surrounded by the second resin 30 in the surface direction (D2-D3 surface direction). That is, the plurality of conductive particles 10 are surrounded by the first resin 20, and the first resin 20 is surrounded by the second resin 30 on the second surface of the second member 112, The first resin 20 and the second resin 30 are insulating resin. Thus, the connection structure 100 has insulation properties in the surface direction (D2-D3 surface direction). This arrangement allows the second resin 30 to reliably insulate between the plurality of first electrodes 110 adjacent in the surface direction (D2-D3 surface direction), between the plurality of second electrodes 114 adjacent in the surface direction (D2-D3 surface direction), and between the first electrode 110 and the second electrode 114 not opposed to each other.

The first resin 20 and the second resin 30 are arranged between the region other than the first electrode 110 of the first surface and the region other than the second electrode 114 of the second surface. The first resin 20 is arranged so as to be in contact with the first surface, and the second resin 30 is arranged so as to be in contact with the region other than the second electrode 114 of the second surface. That is, the first resin 20 and the second resin 30 are in contact in the surface direction (D2-D3 surface direction) between the region other than the first electrode 110 of the first surface and the region other than the second electrode 114 of the second surface and are laminated in the opposing direction (D1 direction) of the electrodes.

The boundary between the first resin 20 and the second resin 30 can be observed by cross-sectional observation of the connection structure 100. From a difference in composition between the first resin 20 and the second resin 30, the boundary between the first resin 20 and the second resin 30 can also be determined by a process/observation apparatus such as a Focused Ion Beam (FIB) process observation apparatus, a Scanning Electron Microscope (SEM), or a Transmission Electron Microscope (TEM).

If the first composite 20' and a second composite 30', which will be described further below, are less phase-soluble, the boundary between the first resin 20 and the second resin 30 can be observed as an interface. If the first composite 20' and a second composite 30' are similar to each other in composition and the interface therebetween disappear in a process described further below, the boundary may be observed as a boundary layer with the first resin 20 and the second resin 30 mixed together.

The first electronic component 101 may be, for example, a flat display such as a liquid-crystal display, an organic EL display, or a plasma display, and the first member 102 is preferably an insulating substrate such as, for example, a glass substrate or a transparent film substrate. The first electrode 110 corresponds to, for example, an external connection terminal provided to a display. The first electrode 110 and the terminal 104 may be formed of a transparent conductive material such as ITO (indium tin oxide) or IZO (indium zinc oxide); a metal such as copper (Cu), aluminum (Al), molybdenum (Mo), or titanium (Ti); an alloy including at least one type thereof (such as Mo—Ti alloy); or a laminated structure of these materials (such as Mo/Cu laminated structure, Mo—Ti alloy/Cu laminated structure, Mo/Al laminated structure, Mo/Al/Mo laminated structure, or Al/Ti laminated structure).

The second electronic component 111 may be a Si chip having an integrated circuit formed thereon. In this case, the second electrode 114 corresponds to an external connection terminal (bonding pad) provided to the integrated circuit. The second member 112 is preferably a silicon substrate, a SiC substrate, a sapphire substrate, a plastic substrate, or the like. The second electrode 114 is preferably formed, for example, of gold (Au) or by plating a surface of copper (Cu) with gold. When the second electronic component 111 is, for example, a flexible printed board, the second member 112 is preferably, for example, an insulating polymer film made of a polyimide, a para-based polyamide, or the like. The second electrode 114 corresponds to an external connection terminal provided to, for example, the flexible printed board, is generally formed of copper (Cu), and has its surface plated with gold.

The size of each of the first electrode 110 and the second electrode 114 when viewed in the opposing direction (D1 direction) is not limited to particular sizes. The distance between the pluralities of first electrodes 110 adjacent in the surface direction (D2-D3 surface direction) (the distance between the pluralities of second electrodes 114 adjacent in the surface direction) is not limited to particular values, and is, for example, at least equal to or large than 5 μm. This configuration allows the first electrode 110 and the second electrode 114 to be electrically connected without impairing insulation properties. In the present embodiment, the first electrode 110 and the second electrode 114 are arranged so that short sides thereof are aligned in a line at one end part of each of the first electronic component 101 and the second electronic component 111. However, this is not meant to be restrictive, and a plurality of rows of the first electrodes 110 and the second electrodes 114 may be arranged, and the first electrodes 110 and the second electrodes 114 may be arranged in a staggered formation.

Figure 1D:
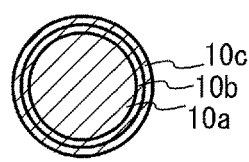
Figure 1E:
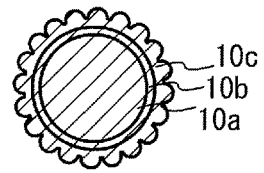

The conductive particle 10 included in the connection structure 100 may be in an oblate spheroidal shape. The diameter (longitudinal diameter) of the conductive particle 10 when viewed in the opposing direction (D1 direction) of the electrodes is in a range between a value equal to or larger than 2 μm and a value equal to or smaller than 10 μm. The conductive particle 10 may originally have a spherical shape with the above-described longitudinal diameter as a diameter, and may be deformed to be flat in the opposing direction (D1 direction) of the electrodes by a range between a value equal to or larger than 10% and a value equal to or smaller than 40% with respect to 100% of the longitudinal diameter. The diameter (longitudinal diameter) and the pressure deformation amount of the conductive particle 10 can be selected as appropriate from the values in the above-described range, depending on the type of the first electronic component 101 and the second electronic component 111, the method for manufacturing each connection structure, and so forth. While the conductive particle 10 has a round shape in the present embodiment as shown in FIG. 1D, this is not meant to be restrictive and, for example, as shown in FIG. 1E, the conductive particle 10 may have a spherical shape with a plurality of protrusions on its surface (a confeito shape). This is more preferable because, with the surface of the spherical shape having a fine convex configuration, the natural oxide film in the connection region can be broken, for example.

The material of the conductive particle 10 is not limited to particular materials, and any can be selected as appropriate for use from known conductive particles. The conductive particle 10 may be a metal-coated particle by coating with metals 10b and 10c such as nickel (Ni), copper (Cu) or gold (Au), a particle core with a highly-hard resin material coated with a rubber-like elastic resin or a particle core 10a with a highly-hard inorganic material coated with a rubber-like inorganic elastic body, as shown in FIG. 1D and FIG. 1E. In metal coating, a Ni/Cu laminated structure, a Ni/Au laminated structure, or a Cu/Au laminated structure may be formed by, for example, barrel sputtering, metal nanoparticle plating, electroless plating, ultrasonic plating, or the like.

The first resin 20 and the second resin 30 are formed by curing the first composite 20' and the second composite 30' including different materials. The materials of the first composite 20' and the second composite 30' are not limited to particular materials, and any can be selected as appropriate from known curable resin materials. In the present embodiment, the curable resin materials of the first composite 20' and the second composite 30' both contain a radical-polymerization resin. As the radical-polymerization resin, a (meth)acrylic monomer or (meth)acrylate oligomer is preferable, and one bonded in an ester form is more preferable. The (meth)acrylate oligomer has at least one (meth)acryloyl group or more and, for example, epoxy acrylate, urethane acrylate, polyester acrylate, polybutadiene acrylate, polyol acrylate, polyether acrylate, silicone resin acrylate, melamine acrylate, or the like can be used. The (meth)acryl oligomer may be monofunctional or polyfunctional, and preferably contains a polyfunctional monomer or oligomer. The curably resin material may be configured by selecting two or more types from (meth)acrylate monomers and (meth)acrylate oligomers.

In particular, as a curable resin material of the second composite 30', one with a low volume shrinkage ratio at the time of curing is preferable. Thus, the (meth)acrylic monomer may contain, for example, an amide methylol structure portion, and may contain a dendrimer or hyper branch polymer structure portion. In a (meth)acrylic monomer compound having an amide methylol structure portion, together with polymerization of carbon-carbon double bonds derived from (meth)acrylic acid, methylene-oxygen bonds in the amide methylol structure portion are cleaved at the time of photocuring. Thus, with the second compound 30' containing a (meth)acrylic monomer compound having at least one amide methylol structure portion formed of —CO—NH—CH$_2$—O— in a molecule as a curable component, the volume shrinkage ratio of the second resin 30 due to curing of the second composite 30' can be more reduced, and warpage due to a difference in flexural rigidity between the first electronic component 101 and the second electronic component 111 can be reduced. With a branch including a dendrimer or hyperbranch polymer structure portion having an acryl group, a Van der Waals distance between branches becomes shorter than a Van der Waals distance between general molecules. Thus, with the second composite 30' containing a dendrimer or hyperbranch polymer structure portion having an acryl group as a curable component, the volume shrinkage ratio of the second resin 30 due to curing of the second composite 30' can be more reduced, and warpage due to a difference in flexural rigidity between the first electronic component 101 and the second electronic component 111 can be reduced.

As the curable resin material of the second composite 30', a fluorene-based acrylate is preferably used. The second composite 30' may contain an ene/thiol-based curable resin containing a composite having an ethylene unsaturated double bond and a thiol compound as a curable component, at least one of these components may contain a compound having a 9,9-bisarylfluorene skeleton. The 9,9-bisarylfluorene compound may be a 9,9-bisarylfluorene compound having an ethylene unsaturated bond and/or a 9,9-bisarylfluoren compound having a mercapto group. As the ethylene unsaturated compound, for example, 9,9-bis(4-acryloyloxyethoxyphenyl)fluorene (produced by Osaka Gas Chemicals Co., Ltd., OGSOL EA-0200) and phenoxyethyl acrylate (produced by KYOEISHA CHEMICAL CO., LTD., LIGHT ACRYLATE POA) may be used. As the thiol compound, for example, pentaerythritol tetra (3-mercaptobutyrate) (produced by SHOWA DENKO K. K., Karenz MT PE1) may be used. With the second composite 30' containing this curable resin material, the volume shrinkage ratio of the second resin 30 due to curing of the second composite 30' can be more reduced, and warpage due to a difference in flexural rigidity between the first electronic component 101 and the second electronic component 111 can be reduced.

As the curable resin material of the second composite 30', an ene compound having in a molecule two or more functional groups selected from a group of an allyl ether group, a vinyl ether group, an acrylate group, and a methacrylate group or ene compound as a mixture of two or more types of the above-described ene compounds, and a substance obtained by performing oxidizing-compound-process on the ene/thiol-based curable resin containing a thiol compound having two or more thiol groups in one molecule may be used. A compound having two or more mercapto groups in one molecule may contain esters obtained from mercaptocarboxylic acid and polyhydric alcohol, aliphatic polythiols, aromatic polythiols, and other polythiols, or one, two or more of these may be used. The oxidizing-compound process is preferably performed with a gas having oxidative capacity. The gas having oxidative capacity is a compound having air properties and oxidative capacity under temperature and atmospheric pressure conditions for performing oxidizing-compound process. As the gas having oxidative capacity, air, oxygen, ozone, or the like can be used, and a mixture gas partially containing any of these may be used. The second composite 30' can enhance stability with time by performing oxidizing-compound process on the above-described photocurable resin material.

The materials of the first composite 20' and the second composite 30' further contain a photocuring initiating component. The photocuring initiating component is a photoradical initiator, and may be any compound which generates radicals by irradiating ultraviolet rays or visible rays. As an ultraviolet-ray radical initiator, for example, an acetophenone-based initiator, a benzoin-ether-based initiator, a benzophenone-based initiator, an α-diketone-based initiator, a thioxanthone-based initiator, or the like can be used. As a visible-ray radical initiator, for example, a camphorquinone-based compound, an acylphosphine oxide compound, or the like can be used. Also, one classified as an ultraviolet-ray radical initiator but capable of visible-ray radical initiation by using combination with a sensitizer may be used. The sensitizer can be appropriately used as required. As the sensitizer, a known composite can be used. For example, an amine-based compound, a (meth)acrylic acid ester of an alkanol amine, or the like can be used. A plurality of types of the photocuring initiating component and the sensitizer can be used in combination. For example, by using an ultraviolet-ray radical initiator and a visible-ray radical initiator in combination, a curable wavelength region can be expanded. The photocuring initiating component is more preferably a photoradical initiator which generates radicals with a irradiation light in a range of wavelength between a value equal to or larger than 300 nm and a value equal to or smaller than 500 nm. The photocuring initiating component is compounded in the curable resin material so that the curable resin material can be curing at room temperatures with a light irradiation for a period of preferably equal to or shorter than approximately three seconds, more preferably equal to or shorter than one second. The curable resin material is selected as appropriate so as to allow curing at room temperatures with the above-described time period.

In the present embodiment, the first composite 20' and the second composite 30' more preferably further contain a shielding part curable activation compound such as, for example, a chain transfer agent. The chain transfer agent transmits radicals generated by light irradiation to a shielding part which light does not directly reach. As the chain transfer agent, for example, a compound containing at least one or more of selected from a urethane bond, a urea bond, and an isocyanate group and one or more of alkoxysilyl group can be used. In photocuring reaction using the above-described chain transfer agent, polyalcohol having a hydroxyl group as one type of anion is generated as a by-product. With this polyalcohol and the alkoxysilyl group containing in the chain transfer agent undergoing a transesterification, curing further proceeds. That is, with the chain transfer agent being contained in the first composite 20' and the second composite 30', radical curing and anion curing occur simultaneously, thereby allowing curing of the shielding part where light does not directly reach.

With the first composite 20' and the second composite 30' containing a shielding part curable activation compound, the first composite 20' and the second composite 30' can be reliably cured even under conditions with the connection method, the material of the first electronic component 101, the second electronic component 111, the first electrode 110, and the second electrode 114, and so forth in which the first composite 20' and the second composite 30' cannot be cured only with the action of a photocuring initiating component by light irradiation.

In the present embodiment, the material of the first composite 20' may further contain an anaerobic curing initiating component. As the anaerobic curing initiating component, a known group including organic peroxide and a curing accelerator can be used. As the organic peroxide, for example, any of hydroperoxides, ketone peroxides, diallyl peroxides, peroxyesters, and so forth can be used. As the curing accelerator, for example, an o-benzoic sulfimide (saccharin), a hydrazine compound, an amine compound, a mercaptan compound, or the like can be used. A plurality of types of the anaerobic curing initiation component and the curing accelerator may be used in combination.

In the present embodiment, the first composite 20' is surrounded by the first surface (including the first electrode 110), the second surface (including the second electrode 114), and the second composite 30'. Furthermore, the first composite 20' is in contact with the first electrode 110, the second electrode 114, and the conductive particles 10. The first electrode 110, the second electrode 114, and the conductive particles 10 contain transition metals. Thus, with the first composite 20' containing an anaerobic curing initiating component, a redox reaction by the cure acceleration agent and the transition metal ions dissolves peroxide, thereby allowing anaerobic curing of the first composite 20' to be initiated.

With the first composite 20' further containing an anaerobic curing initiating component, the first composite 20' can be reliably cured even under conditions with the connection method, the material of the first electronic component 101, the second electronic component 111, the first electrode 110, and the second electrode 114, and so forth in which the first composite 20' cannot be cured only with the action of a photocuring initiating component by light irradiation.

The additive can be appropriately used as required to improve or modify the properties such as fluidity, coating characteristics, preservability, curing characteristics, and physical properties after curing. As the additive, any known compound can be used. Examples of the additive include a silane coupler, a diluent, a modifying agent, a surface active agent, a preservative stabilizer, an antiforming agent, and a leveling agent, although not limited thereto. The silane coupler is not limited to particular agent and for example, any of epoxy-based, amino-based, mercapto/sulfide-based, and ureido-based ones and so forth can be used. With the addition of silane coupler, adhesion at the interface between the organic material and the inorganic material is improved.

The viscosity of the first composite 20' is higher than the viscosity of the second composite 30'. The viscosity of the first composite 20' is in a range between a value equal to or higher than $5 \times 10^3$ cP and a value equal to or lower than $5 \times 10^5$ cP. The viscosity of the second composite 30' is in a range between a value equal to or higher than $2 \times 10^3$ cP and a value equal to or lower than $2 \times 10^5$ cP. It is required that the viscosity of the first composite 20' is twice as high as the viscosity of the second composite 30' or higher. The viscosity of the first composite 20' and the second composite 30' can be controlled also by the degree of polymerization of the resin material contained in the first composite 20' and the second composite 30'. The viscosity of each composite can be selected as appropriate from values within the above-described range, depending on the type of the first electronic component 101 and the second electronic component 111, the method for manufacturing connection structure, the method for composite arrangement, and so forth. If the viscosity of the first composite 20' is lower than $5 \times 10^3$ cP, uniform dispersibility of the conductive particles 10 in the first composite 20' is degraded, and sedimentation and agglomeration tend to occur. With the viscosity of the first composite 20' being higher than the viscosity of the second composite 30', the conductive particles 10 mixed into the first composite 20' is inhibited from flowing, and can be efficiently arranged between the first electrode 110 and the second electrode 114. Therefore, connection reliability between the first electrode 110 and the second electrode 114 can be ensured.

The first resin 20 and the second resin 30 are formed by curing the first composite 20' and the second composite 30'. The volume shrinkage ratio of the first resin 20 due to curing of the first composite 20' and the volume shrinkage ratio of the second resin 30 due to curing of the second composite 30' are both preferably equal to or smaller than 4%, and more preferably equal to or smaller than 2%. If the volume shrinkages ratio of the first resin 20 and the second resin 30 are larger than 4%, an inner shrinkage stress occurs, warpage due to a difference in flexural rigidity between the first electronic component 101 and the second electronic component 111 tends to occur, and physical connection reliability between the first electronic component 101 and the second electronic component 111 is degraded.

The first resin 20 more preferably has high power of adhesion to a conductive material such as a metal material or metal oxide material. The first resin 20 preferably has high power of adhesion to a metal material forming the first electrode 110 and the second electrode 114, and preferably has high power of adhesion to, for example, Au, ITO, and so forth. The second resin 30 preferably has high power of adhesion to a resin material. The second resin 30 preferably has high power of adhesion to an insulating film material forming the first surface of the first member 102 and the second surface of the second member 112, and preferably has high power of adhesion to an insulating material such as, for example, polyimide, para-based polyamide film, P—SiNx, glass, and so forth. The adhesion power of the first resin 20 is preferably in a range equal to or larger than 500 N/m. The adhesion power of the second resin 30 is preferably in a range equal to or larger than 700 N/m. The adhesion power, glass transition temperature, and hardness of each resin can be selected as appropriate, depending on the type of the first electronic component 101 and the second electronic component 111, the method for manufacturing connection structure, and so forth. With the first resin 20 and the second resin 30 each being selected depending on the material of an adherend, the adhesive power between the first surface of the first member 102 and the second surface of the second member 112 can be further improved. Therefore, physical connection reliability between the first electronic component 101 and the second electronic component 111 can be improved.

The Method for Manufacturing Connection Structure

Next, a method for manufacturing connection structure according to one embodiment of the present invention is described by using FIG. 2A to FIG. 5E. Since the existing first electronic component 101 and second electronic component 111 can be used in the present embodiment, their description is omitted. In FIG. 2A to FIG. 5E, the method of forming the connection structure 100 is described in detail.

First, the first composite 20' is arranged on the first surface of the first member 102, and the plurality of conductive particles 10 are arranged on the upper surface of the first electrode 110. The plurality of conductive particles 10 and the first composite 20' are mixed, and are arranged by using an offset printing scheme. Since the mixture of the conductive particles 10 and the first composite 20' contains the conductive particles 10, a pad printing scheme of transferring a printed matter by using a pad is particularly preferable. By using FIG. 2A to FIG. 5E, a method of arranging the plurality of conductive particles 10 and the first composite 20' is described.

Figure 2A:
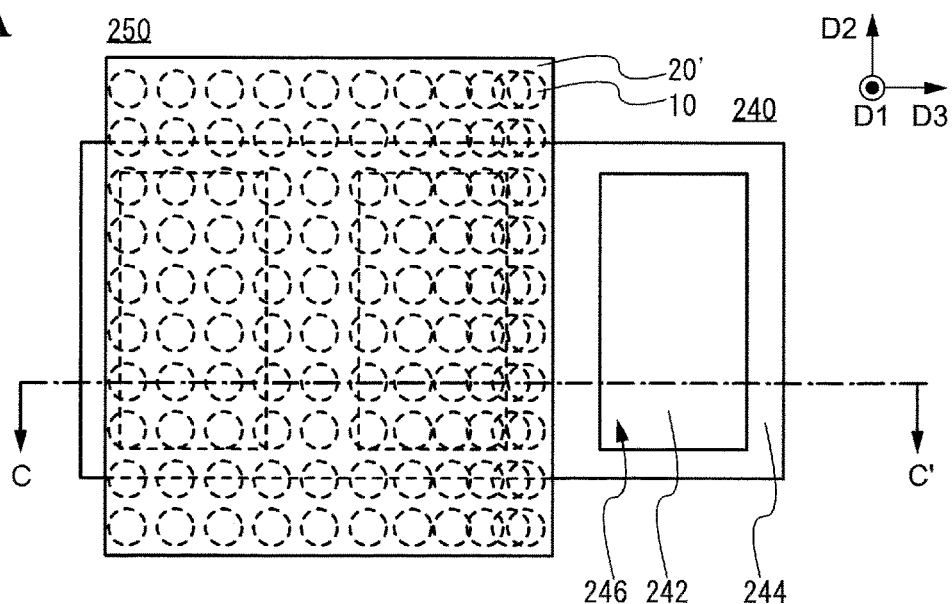
FIG. 2A to FIG. 2C shows a method for producing the connection structure according to an embodiment of the present invention.
Figure 2B:
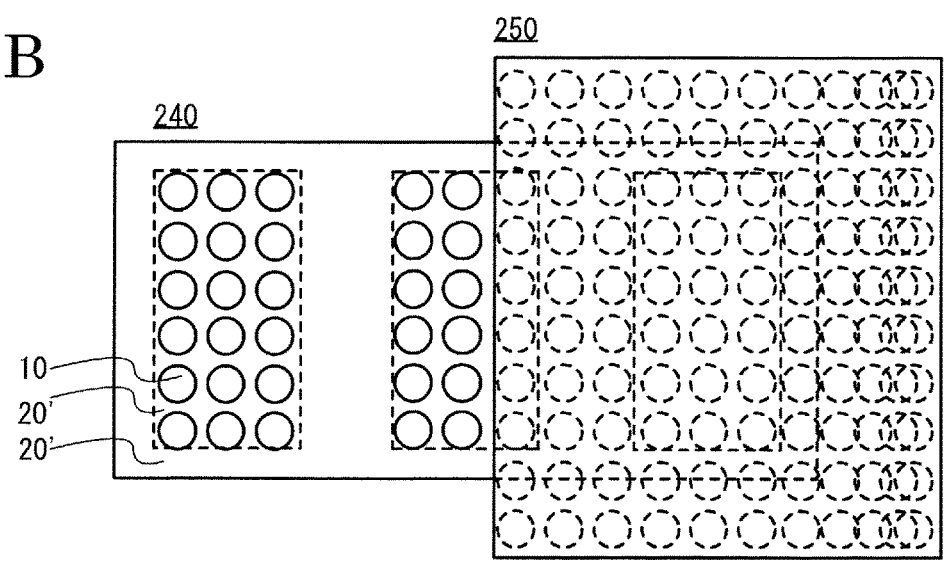
Figure 2C:
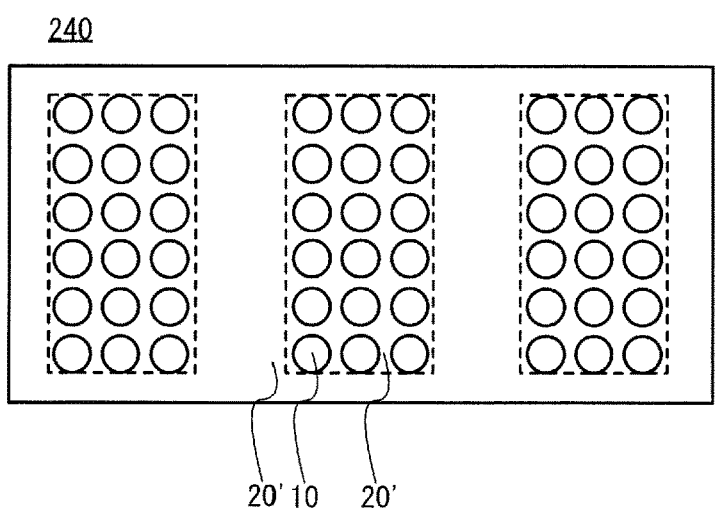
Figure 3A:
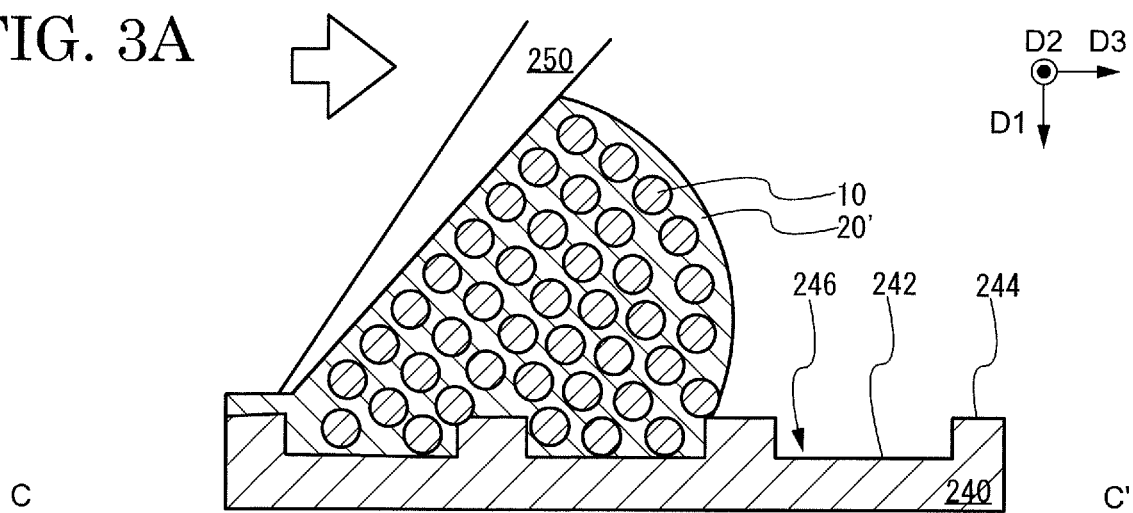
FIG. 3A to FIG. 3C shows a method for producing the connection structure according to an embodiment of the present invention.
Figure 3B:
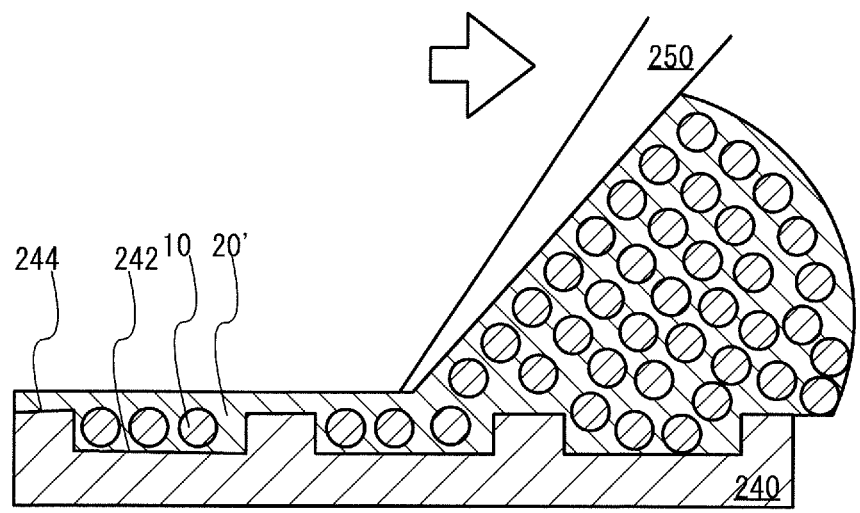
Figure 3C:
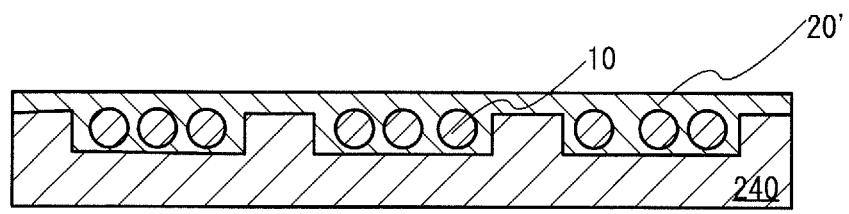

FIG. 2A to FIG. 2C show a process of arranging the mixture of the plurality of conductive particles 10 and the first composite 20' on a plate 240. FIG. 3A to FIG. 3C are sectional views along a C-C' line of FIG. 2A to FIG. 2C. In the present embodiment, the plate 240 is, for example, a planographic intaglio plate. In the present embodiment, the plate 240 has depressed parts 246 corresponding to the first electrodes 110. However, the depressed parts 246 are not limited to correspond to the first electrodes 110, and are only required to correspond to regions on the first surface of the first member 102 where the plurality of conductive particles 10 and the first composite 20' are arranged.

In the present embodiment, the mixture of the conductive particles 10 and the first composite 20' is arranged on the plate 240 by using a blade 250. However, the mixture of the conductive particles 10 and the first composite 20' is not limited to be arranged by using the blade, but may be arranged on the plate 240 by using a roller or the like. As shown in FIG. 2A to FIG. 2C and FIG. 3A to FIG. 3C, the blade 250 is moved from one end to the other end of the plate 240 with its tip being separated from an upper surface 244 of the plate 240. A gap between the tip of the blade 250 and the upper surface 244 of the plate 240 can be set as appropriate in a range between a value larger than 0 μm and a value smaller than Y μm, with the diameter of the conductive particle 10 being taken as Y μm. Since the gap distance is smaller than the diameter of the conductive particle 10 of Y μm, the conductive particles 10 are not arranged but the first composite 20' is arranged on the upper surface 244 of the plate 240.

The depth from the tip of the blade 250 to a bottom surface 242 of the depressed part 246 can be selected as appropriate in a range larger than Y μm when the diameter of the conductive particle 10 is taken as Y. Since the depth from the tip of the blade 250 to the bottom surface 242 of the depressed part 246 is larger than the diameter Y μm of the conductive particle 10, the conductive particles 10 are arranged in the depressed parts 246 together with the first composite 20'.

If the distance from the tip of the blade 250 to the bottom surface 242 of the depressed part 246 is smaller than Y μm, the tip of the blade 250 and the conductive particles 10 tend to make contact, and the conductive particles 10 may not be filled or the filled conductive particles 10 may be damaged. If the gap distance between the tip of the blade 250 and the upper surface 244 of the plate 240 is larger than Y μm, there is a possibility of arranging the conductive particles 10 on the upper surface 244 of the plate 240.

As shown in FIG. 2A to FIG. 2C and FIG. 3A to FIG. 3C, with the blade 250 being moved from one end to the other end of the plate 240, the conductive particles 10 and the first composite 20' are arranged on the plate 240. In the present embodiment, the blade 250 is preferably moved from one end to the other end of the plate 240 in a short side direction (D3 direction) of the depressed parts 246. This allows imbalance of the conductive particles 10 arranged in one depressed part 246 to be inhibited.

As for the concentration of the conductive particles 10 mixed into the first composite 20', the ratio of the conductive particles 10 to the total volume of the conductive particles 10 and the first composite 20' is preferably in a range between a value equal to or larger than 20 volume % and a value equal to or smaller than 60 volume %. If the mixing amount of the conductive particles 10 is smaller than 20 volume %, it is difficult to fill the sufficient number of conductive particles 10 in the depressed parts 246. If the mixing amount of the conductive particles 10 is larger than 60 volume %, operability is degraded, and it is difficult to fill the mixture of the conductive particles 10 and the first composite 20' in the depressed parts 246. By arranging the mixture of the conductive particles 10 and the first composite 20' with the blade 250, the conductive particles 10 and the first composite 20' can be filled in the depressed parts 246 of the plate 240, and the first composite 20' is arranged on the upper surface 244 of the plate 240.

Since the depressed parts 246 have the depth in the above-described range, one conductive particle 10 can be retained in the depth direction (D1 direction) of the depressed parts 246. The number of conductive particles 10 arranged in one depressed part 246 when viewed from the upper surface of the plate 240 is preferably in a range between a value equal to or larger than seven per 400 μm$^2$ and a value equal to or smaller than twenty per 400 μm$^2$. This arrangement allows the conductive particles 10 and the first composite 20' to be efficiently displaced to the pad in a process of displacing the mixture of the conductive particles 10 and the first composite 20' to the pad, which will be described further below.

The depressed parts 246 are preferably separated each other by 5 μm or more. If the depressed parts 246 are separated from each other by less than 5 μm, walls separating the adjacent depressed parts 246 tend to be damaged, and durability of the plate 240 may be degraded.

In the present embodiment, the shape of each depressed part 246 when viewed in the opposing direction (D1 direction) of the electrodes is a rectangle, which is the same as the first electrode 110 (or the second electrode 114). Also, the depressed part 246 has a same shape in a depth direction. That is, the depressed part 246 has a shape obtained by cutting out a cuboid from the plate 240. However, the shape of the depressed part 246 is not limited to this, and the depressed part 246 can take any shape with the depth and the area in the above-described range. For example, the depressed part 246 can take a complex shape.

The plate 240 may be, for example, a glass intaglio plate, a nickel intaglio plate, or a stainless intaglio plate. As required, the plate 240 may be subjected to plasma surface treatment using fluorine-based gas, nickel plating, or DLC (Diamond Like Carbon) process to improve durability of the plate 240.

Figure 4A:
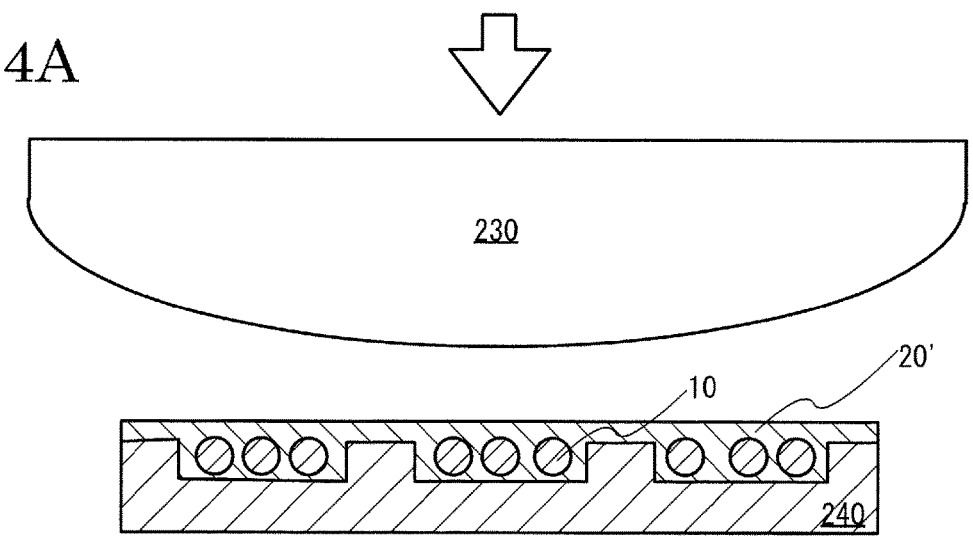
FIG. 4A to FIG. 4C shows a method for producing the connection structure according to an embodiment of the present invention.
Figure 4B:
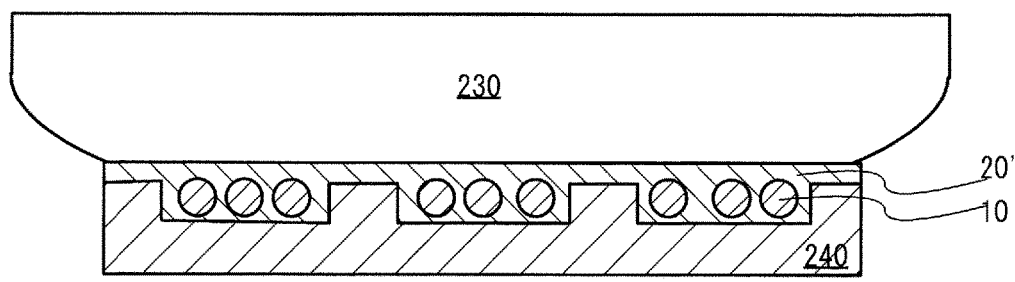
Figure 4C:
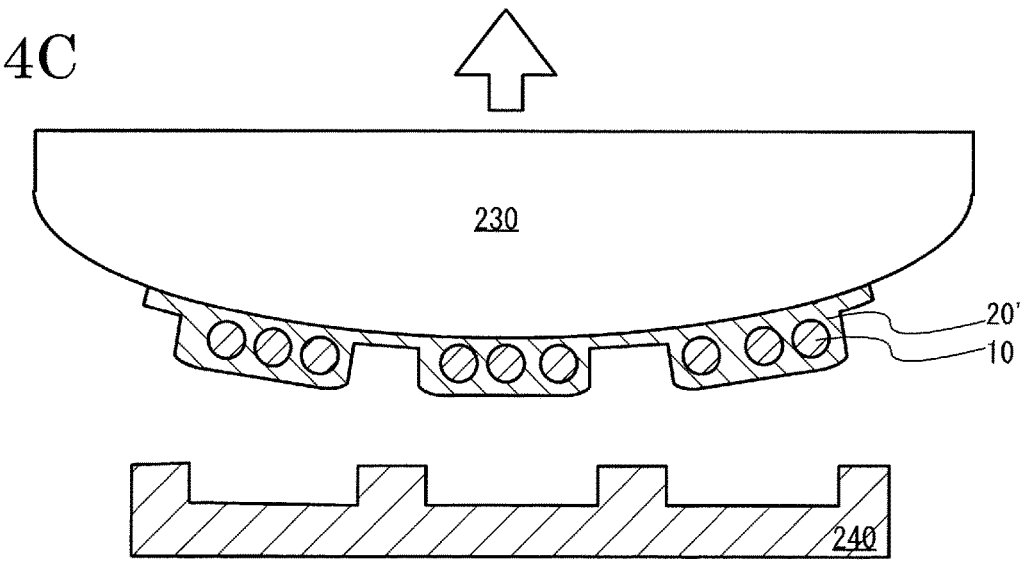

FIG. 4A to FIG. 4C show a process of displacing the mixture of the plurality of conductive particles 10 and the first composite 20' from the plate 240 to the pad 230. As shown in FIG. 4A to FIG. 4C, the pad 230 is pressed in a direction substantially perpendicular to the plate 240, and is then pulled away in the direction substantially perpendicular to the plate 240, thereby displacing, to the pad 230, the first composite 20' arranged on the upper surface 244 of the plate 240 and the conductive particles 10 and the first composite 20' filled in the depressed parts 246 of the plate 240. Since the viscosity of the first composite 20' is in a range between a value equal to or higher than $5 \times 10^3$ cP and a value equal to or lower than $5 \times 10^5$ cP, the conductive particles 10 mixed into the first composite 20' can be retained on the surface of the pad 230.

The material of the pad 230 is preferably, for example, an elastic silicone resin or the like. The shape of the pad 230 preferably has at least a convex configuration. The shape of the pad 230 can be selected as appropriate depending on the shape of the first electronic component 101, the plate 220, and the like.

Figure 5A:
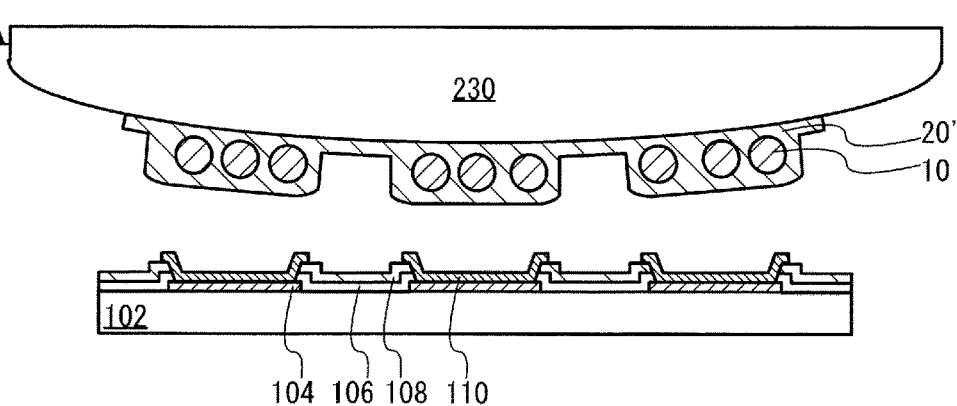
FIG. 5A to FIG. 5E shows a method for producing the connection structure according to an embodiment of the present invention.
Figure 5B:
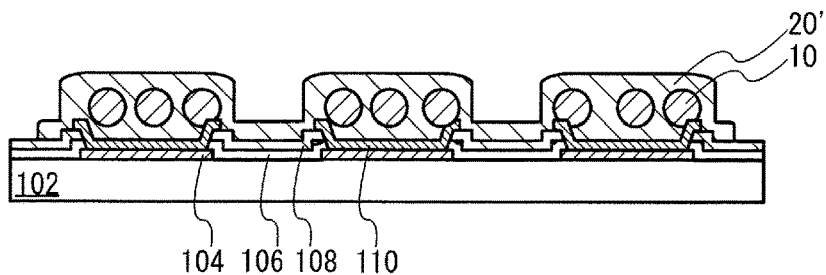

FIG. 5A and FIG. 5B show a process of transferring the mixture of the plurality of conductive particles 10 and the first composite 20' from the pad 230 to the first surface of the first member 102. As shown in FIG. 5A and FIG. 5B, the pad 230 is pressed in a direction substantially perpendicular to the first surface and is then pulled away in the direction substantially perpendicular to the first surface, thereby transferring the mixture of the conductive particles 10 and the first composite 20' displaced to the pad 230 onto the first surface. Here, the first composite 20' and the conductive particles 10 to be transferred from the depressed parts 246 of the plate 240 are arranged so as to be in contact with the first electrode 110. That is, the first composite 20' is arranged on the first surface of the first member 102, and the conductive particles 10 are arranged on the upper surface of the first electrode 110. The viscosity of the curable resin material of the first composite 20' is in the range between a value equal to or higher than $5 \times 10^3$ cP and a value equal to or lower than $5 \times 10^5$ cP. Thus, the conductive particles 10 mixed into the first composite 20' can be retained on the first electrode 110. The use of this method allows the conductive particles 10 and the first composite 20' to be reliably arranged in a predetermined region on the first electrode 110.

With the depth of the depressed parts 246, the first composite 20' and the conductive particles 10 transferred from the depressed parts 246 of the plate 240 are thickly arranged in the opposing direction (D1 direction) of the electrodes on the first electrode 110 on the first member 102. On the other hand, without the depth of the depressed parts 246, the first composite 20' transferred from the upper surface 244 of the plate 240 is thinly arranged in the opposing direction (D1 direction) of the electrodes in the region other than the first electrode 110 on the first member 102. However, this is not meant to be restrictive, and the first composite 20' may not be transferred from the upper surface 244 of the plate 240 to the pad 230. The first composite 20' may not be transferred from the pad 230 to the region other than the first electrode 110 of the first surface. On the first surface of the first member 102, the first composite 20' forms a convex/concave configuration in the opposing direction (D1 direction) of the electrodes. On the first surface of the first member 102, the conductive particles 10 form a convex configuration together with the first composite 20'.

Figure 5C:
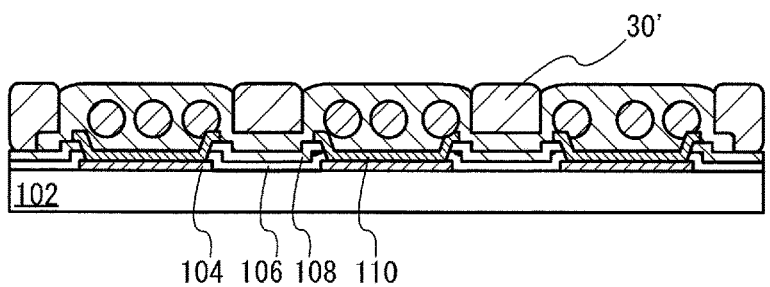

Next, the second composite 30' is arranged on the first surface of the first member 102. As shown in FIG. 5C, the second composite 30' is arranged in a region other than the first electrode 110 of the first surface. Here, the first composite 20' transferred from the upper surface 244 of the plate 240 is arranged in the region other than the first electrode 110 of the first surface. Thus, the second composite 30' is arranged to be superposed so as to be in contact with the first composite 20'. The first composite 20' and the conductive particles 10 forming the convex/concave configuration on the first surface of the first member 102 are buried by the second composite 30'. That is, the first composite 20', the conductive particles 10, and the second composite 30' form a substantially flat configuration on the first surface of the first member 102. In other words, the second composite 30' is arranged at a region other than the region where the plurality of conductive particles 10 and the first composite 20' are arranged (convex configuration) on the first surface of the first member 102. The second composite 30' is disposed on the first surface of the first member 102 in a region where the first composition 20' is arranged (concave configuration). Although not shown, in the present embodiment, as in the arrangement of the mixture of the conductive particles 10 and the first composite 20', the second composite 30' is arranged by using a pad printing scheme. However, the method of arranging the second composite 30' is not limited to this scheme, and any existing method capable of different coating in a region other than the region where the plurality of conductive particles 10 and the first composite 20' are arranged can be used. For example, coating by inkjet or a dispenser, screen printing, or the like can be used.

The viscosity of the second composite 30' is in a range between a value equal to or higher than $2 \times 10^3$ cP and a value equal to or lower than $2 \times 10^5$ cP. It is required that the viscosity of the first composite 20' is twice as high as high as the viscosity of the second composite 30' or higher. This allows a flow of the conductive particles 10 mixed into the first composite 20' to be inhibited, and the conductive particles 10 can be retained on the first electronic component 101.

Figure 5D:
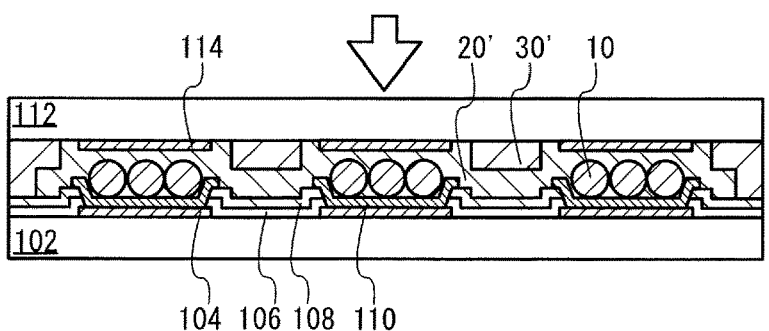

Next, the second member 112 is mounted on the first surface of the first member 102. As shown in FIG. 5D, the first surface of the first member 102 and the second surface of the second member 112 are arranged so as to be opposed to each other so that the corresponding plurality of first electrodes 110 and the plurality of second electrodes 114 are opposed to each other. The first member 102 and the second member 112 are pressed so that the first surface of the first member 102 and the second surface of the second member 112 are pushed in directions substantially perpendicular to the respective surfaces. The first surface of the first member 102 and the second surface of the second member 112 are pressure-welded to the conductive particles 10, the first composite 20', and the second composite 30'. Here, the first composite 20' arranged on the first electrode 110 has a viscosity higher than that of the second composite 30', and is thus retained on the first electrode 110 together with the conductive particles 10. The conductive particles 10 and the first composite 20' arranged on the first electrode 110 are arranged so as to be in contact with the second electrode 114, and the second composite 30' arranged on the region other than the first electrode 110 on the first surface is arranged so as to be in contact with the region other than the second electrode 114 on the second surface.

Figure 5E:
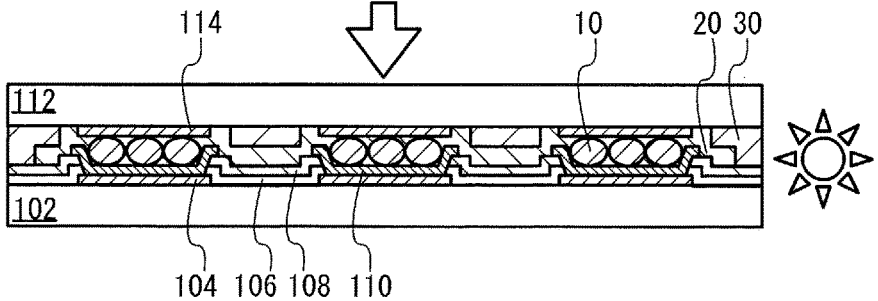

As shown in FIG. 5E, the first member 102 and the second member 112 are further pressed to push the first surface of the first member 102 and the second surface of the second member 112 in the directions substantially perpendicular to the respective surfaces. Here, a sufficient pressure is applied to cause the opposing first electrode 110 and second electrode 114 to be in contact with upper and lower sides of one conductive particle 10. The pressure to push the first surface of the first member 102 and the second surface of the second member 112 can be adjusted as appropriate by a repulsive force of the conductive particles 10 and elastic forces of the first composite 20' and the second composite 30'.

Here, the conductive particles 10 are pressurized until deformed into an oblate spheroidal shape by receiving pressure from the first electrode 110 and the second electrode 114. The pressure deformation amount of the conductive particles 10 is controlled in a range between a value equal to or larger than 10% and a value equal to or smaller than 40% with respect to a longitudinal diameter of the conductive particles 10 of 100%. Here, a stress is applied among the first electrode 110, the conductive particles 10, and the second electrode 114, thereby eliminating the first composite 20' between the first electrode 110 and the conductive particles 10 and between the second electrode 114 and the conductive particles 10. Furthermore, even if a natural oxide film is formed on the first electrode 110, the conductive particles 10, or the second electrode 114 and its surface is insulated, the first electrode 110 and the second electrode 114 are press-welded with the conductive particles 10 interposed therebetween, thereby breaking the natural oxide film to form a conductive route. Deformation of the conductive particles 10 can increase the area of contact between the first electrode 110 and the conductive particles 10 and the area of contact between the second electrode 114 and the conductive particles 10. This arrangement allows the conductive particles 10 to electrically connect the first electrode 110 and the second electrode 114.

With the first member 102 and the second member 112 pressed, the connection structure 100 is irradiated with light. The wavelength region of light is preferably an ultraviolet ray and/or visible ray region. In particular, ultraviolet rays are more preferable. The wavelength region of light can be selected as appropriate depending on the photocuring initiating component and the like included in the first composite 20' and the second composite 30'. The direction of light irradiation can be selected as appropriate from a first electronic component 101 side or a second electronic component 111 side, depending on the wavelength region of light, the materials of the first member 102 and the second member 112, and so forth. Also, irradiation of light from both sides is preferable, and irradiation from a side surface without a shielding substance is also effective. The light irradiation time can be selected as appropriate depending on the photocuring initiating component, the curable resin material, and the like contained in the first composite 20' and the second composite 30'. In general, the light irradiation time is preferably equal to or shorter than approximately three seconds and, more preferable equal to or shorter than one second. In other words, light irradiation intensity, the photocuring initiating component, the curable resin material, and so forth are selected as appropriate so that curing is achieved at room temperatures within the above-described light irradiation time.

Light irradiation causes most of the first composite 20' and the second composite 30' included in the connection structure 100 to be cured at room temperatures. However, for example, a portion between the first electrode 110 and the second electrode 114 which sufficient light does not reach may be insufficiently cured. Thus, the material of the first composite 20' more preferably contains a shielding part curable activation compound, an anaerobic curing initiating component, or the like. By containing a shielding part curable activation compound, an anaerobic curing initiating component, or the like, it is possible to promote curing at room temperatures even in a portion which sufficient light does not reach. By curing the first composite 20' and the second composite 30', the first resin 20 and the second resin 30 are formed. This configuration allows physical connection between the first surface of the first electronic component 101 and the second surface of the second electronic component 111.

According to the present embodiment, a connection structure and a method for manufacturing connection structure can be provided that can ensure conductivity between the opposing electrodes with a simple process and can reduce a short circuit between adjacent connection electrodes, even if the electrodes arranged on the electronic components have high fineness and high density. Furthermore, since no heat curing connection scheme is used, the electrodes of the upper and lower substrates having different coefficients of thermal expansion can be connected with high accuracy.

Second Embodiment

The configuration of a connection structure according to a second embodiment is the same as the configuration of the connection structure according to the first embodiment. A method for manufacturing connection structure according to the present embodiment is the same as the method for manufacturing connection structure according to the first embodiment except that the second composite 30' is arranged on the region other than the second electrode 114 of the second surface. The same description as that of the first embodiment is omitted, and parts different from the methods for manufacturing connection structure according to the first embodiment are described herein.

The Method for Manufacturing Connection Structure

The method for manufacturing connection structure according to one embodiment of the present invention is described by using FIG. 6A to FIG. 6F. Since the existing first electronic component 101 and second electronic component 111 can be used in the present embodiment, their description is omitted. In FIG. 6A to FIG. 6F, the method of forming the connection structure 100 is described in detail.

First, the first composite 20' is arranged on the first surface of the first member 102, and the plurality of conductive particles 10 are arranged on the upper surface of the first electrode 110. The plurality of conductive particles 10 and the first composite 20' are mixed, and are arranged by using an offset printing scheme. Since the mixture of the conductive particles 10 and the first composite 20' contains the conductive particles 10, a pad printing scheme of transferring a printed matter by using a pad is particularly preferable. The region and method for arranging the mixture of the plurality of conductive particles 10 and the first composite 20' are the same as those of the method for manufacturing connection structure according to the first embodiment, and are therefore not described herein.

Figure 6A:
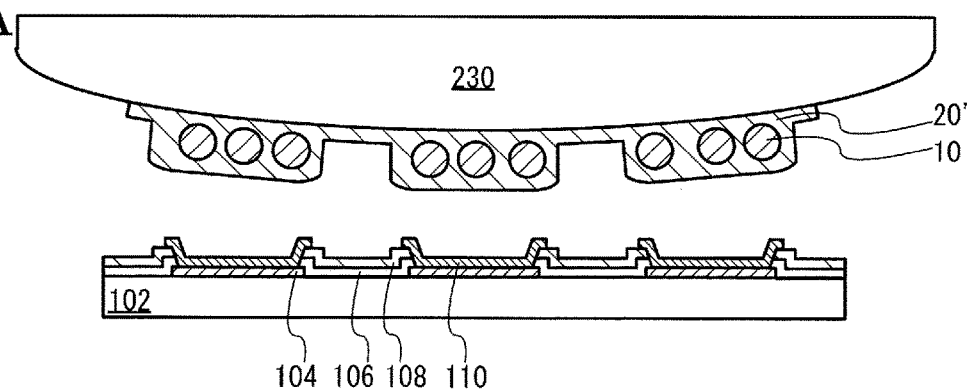
FIG. 6A to FIG. 6F shows a method for producing the connection structure according to an embodiment of the present invention.
Figure 6B:
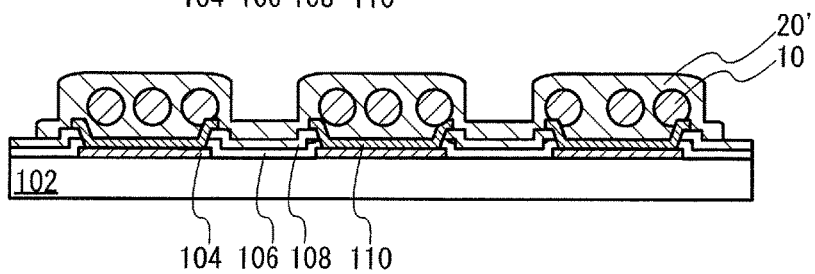

FIG. 6A and FIG. 6B show a process of transferring the mixture of the plurality of conductive particles 10 and the first composite 20' from the pad 230 to the first surface of the first member 102. As shown in FIG. 6A and FIG. 6B, the pad 230 is pressed in a direction substantially perpendicular to the first surface, and is then pulled away in the direction substantially perpendicular to the first surface, thereby transferring the mixture of the conductive particles 10 and the first composite 20' displaced to the pad 230 onto the first surface. Here, the first composite 20' and the conductive particles 10 transferred from the depressed parts 246 of the plate 240 are arranged so as to be in contact with the first electrode 110. That is, the first composite 20' is arranged on the first surface of the first member 102, and the conductive particles 10 are arranged on the upper surface of the first electrode 110. The viscosity of the curable resin material of the first composite 20' is in the range between a value equal to or higher than $5 \times 10^3$ cP and a value equal to or lower than $5 \times 10^5$ cP. Thus, the conductive particles 10 mixed into the first composite 20' can be retained on the first electrode 110. The use of this method allows the conductive particles 10 and the first composite 20' to be reliably arranged in a predetermined region on the first electrode 110.

With the depth of the depressed parts 246, the first composite 20' and the conductive particles 10 transferred from the depressed parts 246 of the plate 240 are thickly arranged in the opposing direction (D1 direction) of the electrodes on the first electrode 110 on the first member 102. On the other hand, without the depth of the depressed parts 246, the first composite 20' transferred from the upper surface 244 of the plate 240 is thinly arranged in the opposing direction (D1 direction) of the electrodes in the region other than the first electrode 110 on the first member 102. However, this is not meant to be restrictive, and the first composite 20' may not be transferred from the upper surface 244 of the plate 240 to the pad 230. The first composite 20' may not be transferred from the pad 230 to the region other than the first electrode 110 of the first surface. On the first surface of the first member 102, the first composite 20' forms a convex/concave configuration in the opposing direction (D1 direction) of the electrodes. On the first surface of the first member 102, the conductive particles 10 form a convex configuration together with the first composite 20'.

Figure 6C:
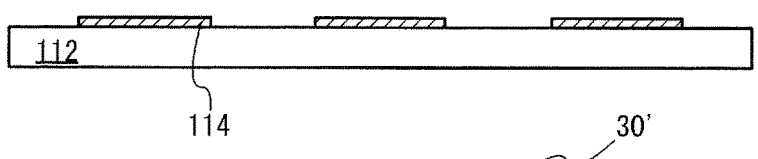
Figure 6D:
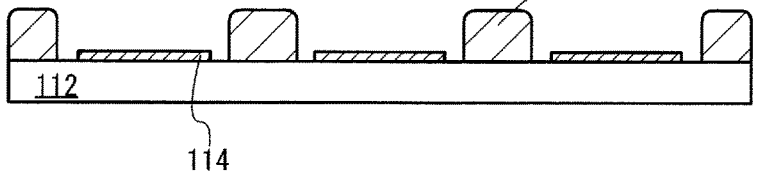

Next, the second composite 30' is arranged on the second surface of the second member 112. As shown in FIG. 6C and FIG. 6D, the second composite 30' is arranged in a region other than the second electrode 114 of the second surface of the second member 112. In other words, the second composite 30' is arranged on the second surface of the second member 112 in a region corresponding to the region other than the region where the plurality of conductive particles 10 and the first composite 20' are arranged. Although not shown, in the present embodiment, the second composite 30' is arranged by using a pad printing scheme. However, the method of arranging the second composite 30' is not limited to this scheme, and any existing method capable of different coating in a region other than the region where the plurality of conductive particles 10 and the first composite 20' are arranged can be used. For example, coating by inkjet or a dispenser, screen printing, or the like can be used.

The viscosity of the second composite 30' is in a range between a value equal to or higher than $2 \times 10^3$ cP and a value equal to or lower than $2 \times 10^5$ cP. This allows a flow of the second composite 30' to be inhibited.

Figure 6E:
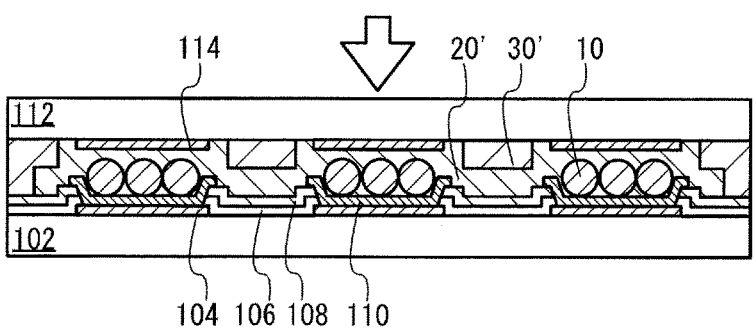

Next, the second member 112 is mounted on the first surface of the first member 102. As shown in FIG. 6E, the first surface of the first member 102 and the second surface of the second member 112 are arranged so as to be opposed to each other so that the corresponding plurality of first electrodes 110 and the plurality of second electrodes 114 are opposed to each other. The first member 102 and the second member 112 are pressed so that the first surface of the first member 102 and the second surface of the second member 112 are pushed in directions substantially perpendicular to the respective surfaces. The first surface of the first member 102 and the second surface of the second member 112 are pressure-welded to the conductive particles 10, the first composite 20', and the second composite 30'. Here, the first composite 20' arranged on the first electrode 110 has a viscosity higher than that of the second composite 30', and is thus retained on the first electrode 110 together with the conductive particles 10. The conductive particles 10 and the first composite 20' arranged on the first electrode 110 are arranged so as to be in contact with the second electrode 114, and the second composite 30' arranged on the region other than the second electrode 114 of the second surface is arranged so as to be in contact with the first composite 20' arranged on the region other than the first electrode 110 of the first surface. The first composite 20' and the conductive particles 10 forming the convex/concave configuration on the first surface of the first member 102 are buried by the second composite 30' arranged on the second surface of the second member 112. That is, a space between the first surface of the first member 102 and the second surface of the second member 112 is filled by the first composite 20', the conductive particles 10, and the second composite 30'. In other words, the second composite 30' arranged on the second surface of the second member 112 is arranged on the first surface of the first member 102 in a region other than the region where the plurality of conductive particles 10 and the first composite 20' are arranged (convex configuration). The second composite 30' arranged on the second surface of the second member 112 is arranged on the first surface of the first member 102 and a region where the first composite 20' is arranged (concave configuration).

Figure 6F:
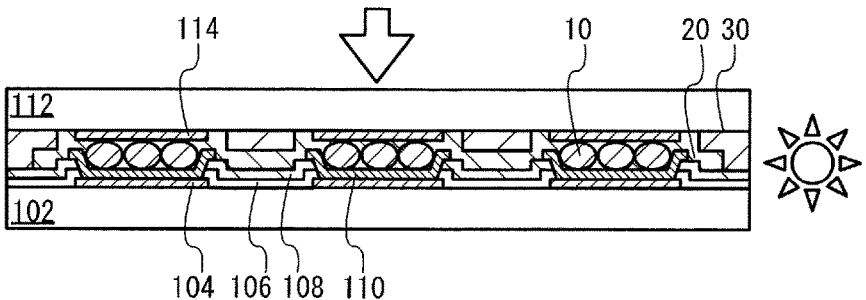

As shown in FIG. 6F, the first member 102 and the second member 112 are further pressed to push the first surface of the first member 102 and the second surface of the second member 112 in the directions substantially perpendicular to the respective surfaces. Here, a sufficient pressure is applied to cause the opposing first electrode 110 and second electrode 114 to be in contact with upper and lower sides of one conductive particle 10. The pressure to push the first surface of the first member 102 and the second surface of the second member 112 can be adjusted as appropriate by a repulsive force of the conductive particles 10 and elastic forces of the first composite 20' and the second composite 30'. This configuration allows electrical connection between the first electrode 110 and the second electrode 114.

With the first member 102 and the second member 112 pressed, the connection structure 100 is irradiated with light to cure the first composite 20' and the second composite 30'. A method of curing the first composite 20' and the second composite 30' is the same as that of the method for manufacturing connection structure according to the first embodiment, and is therefore not described herein. By curing the first composite 20' and the second composite 30', the first resin 20 and the second resin 30 are formed. This configuration allows physical connection between the first surface of the first electronic component 101 and the second surface of the second electronic component 111.

According to the present embodiment, a connection structure and a method for manufacturing connection structure can be provided that can ensure conductivity between the opposing electrodes with a simple process and can reduce a short circuit between adjacent connection electrodes, even if the electrodes arranged on the electronic component have high fineness and high density. Furthermore, since no heat curing connection scheme is used, the electrodes of the upper and lower substrates having different coefficients of thermal expansion can be connected with high accuracy.

Third Embodiment

The configuration of a connection structure according to a third embodiment is the same as the configuration of the connection structure according to the first embodiment except that the stacking order of the first resin 20 and the second resin 30 disposed between the region other than the first electrode 110 on the first surface and the region other than the second electrode 114 on the second surface. A method for manufacturing connection structure according to the present embodiment is the same as the method for manufacturing connection structure according to the first embodiment except that the process of arranging the mixture of the plurality of conductive particles 10 and the first composite 20' and the process of arranging the second composite 30' change places. The same description as that of the first embodiment is omitted, and parts different from the methods for manufacturing connection structure according to the first embodiment are described herein.

Configuration of Connection Structure

Figure 7A:
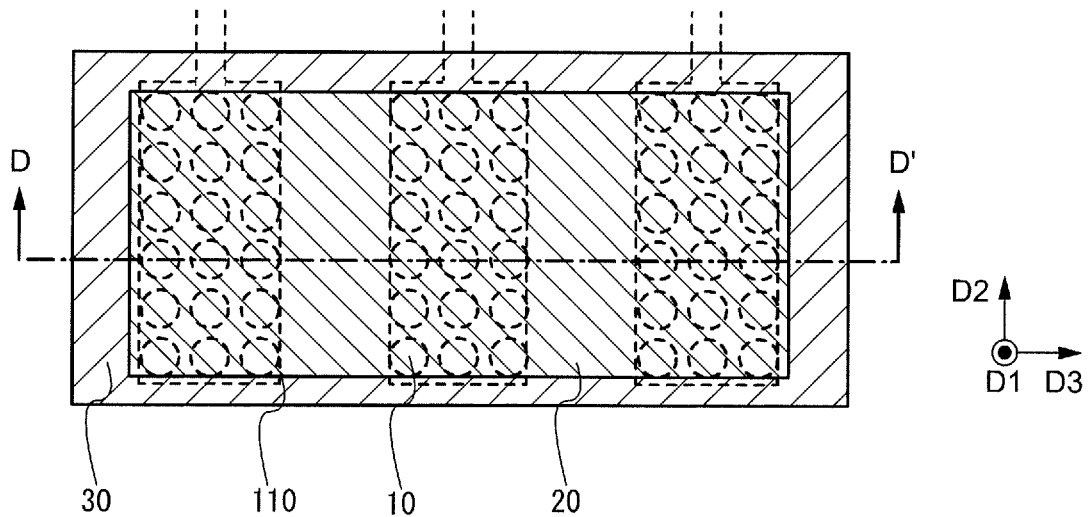
FIG. 7A to FIG. 7C shows a configuration of a connection structure according to an embodiment of the present invention.
Figure 7B:
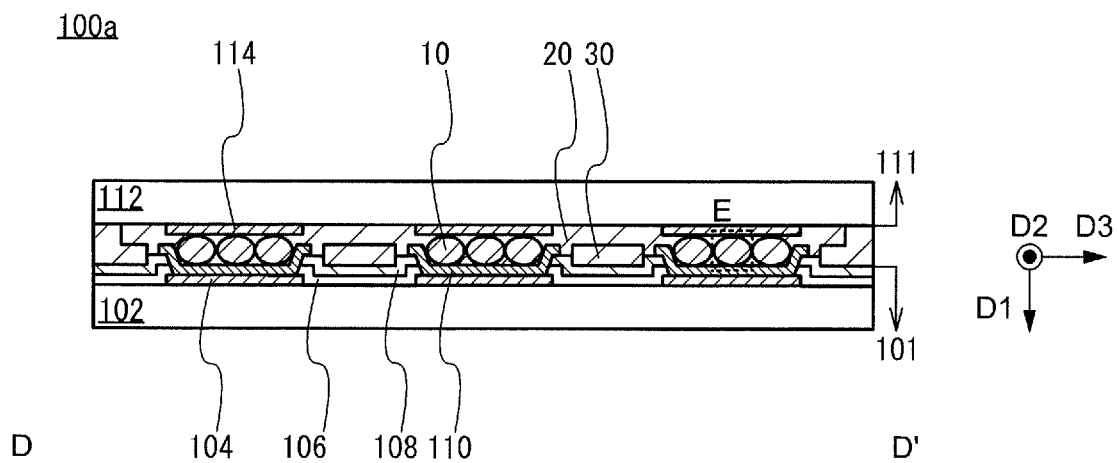
Figure 7C:
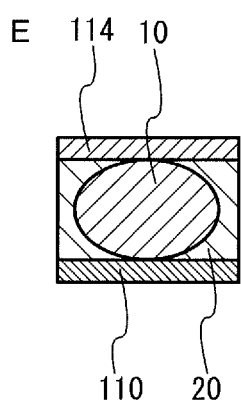

FIG. 7A to FIG. 7C show the configuration of the connection structure according to one embodiment of the present invention. FIG. 7A is a plan view of the connection structure according to one embodiment of the present invention. FIG. 7B is a sectional view along a D-D' line of FIG. 7A. FIG. 7C is an enlarged sectional view of a conductive particle in a region E of FIG. 7B.

As shown in FIG. 7A and FIG. 7B, a first electronic component 101 includes a terminal 104, a first insulating film 106, a second insulating film 108, and a first electrode 110 on a connection surface (first surface) of a first member 102. On the connection surface (first surface) of the first electronic component 101, a second electronic component 111 is mounted. The second electronic component 111 includes a second electrode 114 on a connection surface (second surface) of a second member 112. The first surface of the first electronic component 101 and the second surface of the second electronic component 111 are arranged so as to be opposed to each other. The connection structure 100 serves a function of physical connection between the first electronic component 101 and the second electronic component 111 and electrical connection between the first electrode 110 and the second electrode 114. The connection structure 100a includes the first member 102 having the first surface, the first electrode 110, the second member 112 having the second surface, the second electrode 114, the conductive particles 10, the first resin 20, and the second resin 30.

A plurality of first electrodes 110 and a plurality of second electrode 114 are arranged so as to be the first electrode 110 and the second electrode 114 are opposed to each other. The plurality of conductive particles 10 and the first resin 20 are arranged between the opposing first electrode 110 and second electrode 114. The plurality of conductive particles 10 are arranged in the surface direction (D2-D3 surface direction) between the opposing first electrode 110 and second electrode 114. One conductive particle 10 is arranged between the opposing first electrode 110 and second electrode 114 in the opposing direction (D1 direction) of the first electrode 110 and the second electrode 114. Each of the plurality of conductive particles 10 are in contact with the opposing first electrode 110 and second electrode 114. As shown in FIG. 7C, the conductive particle 10 is pressured and deformed in the opposing direction (D1 direction) between the first electrode 110 and the second electrode 114 by a method for manufacturing connection structure, which will be described further below. That is, a distance between the first electrode 110 and the second electrode 114 in the opposing direction (D1 direction) of the electrodes is substantially equal to the height of the conductive particle 10 in the opposing direction (D1 direction) of the electrodes. The height of the conductive particle 10 in the opposing direction (D1 direction) of the electrodes is pressured and deformed by approximately 10% to 40%. With a stress provided among the first electrode 110, the conductive particles 10, and the second electrode 114, the first resin 20 and the second resin 30 are eliminated at the contact part between the first electrode 110 and the conductive particle 10 and the contact part between the second electrode 114 and the conductive particle 10. Furthermore, even if a natural oxide film is formed on the first electrode 110, the conductive particle 10, or the second electrode 114 and its surface is insulated, the first electrode 110 and the second electrode 114 are pressure-welded with the conductive particle 10 interposed therebetween, thereby breaking the natural oxide film to form a conductive route. Furthermore, deformation of the conductive particle 10 can increase the area of contact between the first electrode 110 and the conductive particle 10 and the area of contact between the second electrode 114 and the conductive particle 10. This arrangement allows the conductive particle 10 to electrically connect the first electrode 110 and the second electrode 114.

The plurality of conductive particles 10 are dispersed in the first resin 20 between the first electrode 110 and the second electrode 114. Each of the plurality of conductive particles 10 are surrounded by the first resin 20 between the first electrode 110 and the second electrode 114 in the surface direction (D2-D3 surface direction). The first resin 20 is an insulating resin. Thus, the connection structure 100a has insulation properties in the surface direction (D2-D3 surface direction). However, the plurality of conductive particles 10 arranged between the opposing first electrode 110 and second electrode 114 and adjacent to each other in the surface direction (D2-D3 surface direction) may be in contact with each other. When the conductive particles 10 adjacent to each other in the surface direction (D2-D3 surface direction) are in contact with each other, the conductive particles 10 adjacent to each other are also electrically connected. This arrangement allows the conductive particles 10 to further reliably connect the opposing first electrode 110 and second electrode 114 electrically. The distance between the adjacent conductive particles 10 can be appropriately controlled according to the concentration of the conductive particles 10 mixed into a first composite 20', which will be described further below.

In the present embodiment, the first resin 20 is arranged also in a region other than the second electrode 114 of the second surface when viewed in the opposing direction (D1 direction) of the electrodes. The first resin 20 is arranged also between the plurality of second electrodes 114 and around the plurality of second electrodes 114 on the second surface when viewed in the opposing direction (D1 direction) of the electrodes. On the other hand, the first resin 20 is not arranged at an end of the second surface when viewed in the opposing direction (D1 direction) of the electrodes. Here, the conductive particles 10 are not arranged in a region other than the first electrode 110 of the first surface (the second electrode 114 of the second surface) when viewed in the opposing direction (D1 direction) of the electrodes. That is, the conductive particles 10 are arranged on the first electrode 110 (or the second electrode 114).

The second resin 30 is further arranged between the first surface of the first member 102 and the second surface of the second member 112. The second resin 30 is arranged in a region not between the opposing first electrode 110 and second electrode 114. In the present embodiment, the second resin 30 is arranged in a region other than the first electrode 110 of the first surface when viewed in the opposing direction (D1 direction) of the electrodes. That is, the second resin 30 is arranged on the first surface of the first member 102 between the plurality of first electrodes 110 adjacent to each other in the surface direction (D2-D3 surface direction) and on the periphery thereof. The conductive particles 10 and the first resin 20 arranged on the first electrode 110 on the first surface of the first member 102 are surrounded by the second resin 30 in the surface direction (D2-D3 surface direction). That is, the plurality of conductive particles 10 are surrounded by the first resin 20, and the first resin 20 is surrounded by the second resin 30 on the first surface of the first member 102. The first resin 20 and the second resin 30 are insulating resin. Thus, the connection structure 100a has insulation properties in the surface direction (D2-D3 surface direction). This arrangement allows the second resin 30 to reliably insulate between the plurality of first electrodes 110 adjacent in the surface direction (D2-D3 surface direction), between the plurality of second electrodes 114 adjacent in the surface direction (D2-D3 surface direction), and between the first electrode 110 and the second electrode 114 not opposed to each other.

The first resin 20 and the second resin 30 are arranged between the region other than the first electrode 110 of the first surface and the region other than the second electrode 114 of the second surface. The first resin 20 is arranged so as to be in contact with the second surface, and the second resin 30 is arranged so as to be in contact with the region other than the first electrode 110 of the first surface. That is, the first resin 20 and the second resin 30 are in contact in the surface direction (D2-D3 surface direction) between the region other than the first electrode 110 of the first surface and the region other than the second electrode 114 of the second surface and are laminated in the opposing direction (D1 direction) of the electrodes.

The Method for Manufacturing Connection Structure

The method for manufacturing connection structure according to one embodiment of the present invention is described by using FIG. 8A to FIG. 8F. Since the existing first electronic component 101 and second electronic component 111 can be used in the present embodiment, their description is omitted. In FIG. 8A to FIG. 8F, the method of forming the connection structure 100a is described in detail.

Figure 8A:
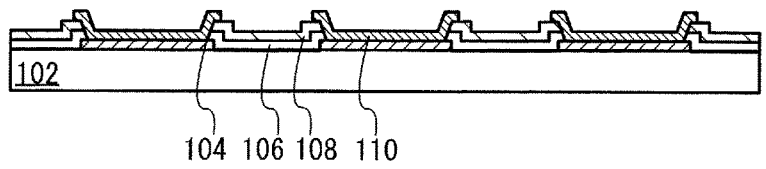
FIG. 8A to FIG. 8F shows a method for producing the connection structure according to an embodiment of the present invention.
Figure 8B:
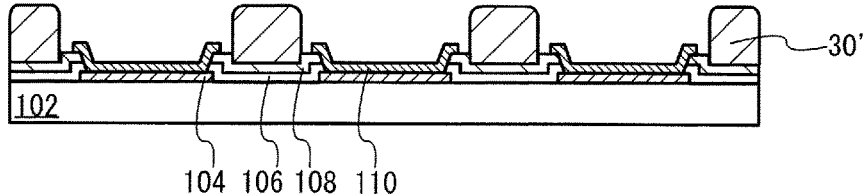

First, the second composite 30' is arranged on the first surface of the first member 102. As shown in FIG. 8A and FIG. 8B, the second composite 30' is arranged in a region other than the first electrode 110 on the first surface of the first member 102. In other word, the second composite 30' is arranged at a region other than the region where the plurality of conductive particles 10 and the first composite 20' are arranged at the first surface of the first member 102. Although not shown, in the present embodiment, the second composite 30' is arranged by using a pad printing scheme. However, the method of arranging the second composite 30' is not limited to this scheme, and any existing method capable of different coating in a region other than the region where the plurality of conductive particles 10 and the first composite 20' are arranged can be used. For example, coating by inkjet or a dispenser, screen printing, or the like can be used.

The viscosity of the second composite 30' is in a range between a value equal to or higher than $2 \times 10^3$ cP and a value equal to or lower than $2 \times 10^5$ cP. This allows a flow of the second composite 30' to be inhibited.

Next, the first composite 20' is arranged on the first surface of the first member 102, and the plurality of conductive particles 10 are arranged on the upper surface of the first electrode 110. The plurality of conductive particles 10 and the first composite 20' are mixed, and are arranged by using an offset printing scheme. Since the mixture of the conductive particles 10 and the first composite 20' contains the conductive particles 10, a pad printing scheme of transferring a printed matter by using a pad is particularly preferable. The region and method for arranging the mixture of the plurality of conductive particles 10 and the first composite 20' are the same as those of the method for manufacturing connection structure according to the first embodiment, and therefore are not described herein.

Figure 8C:
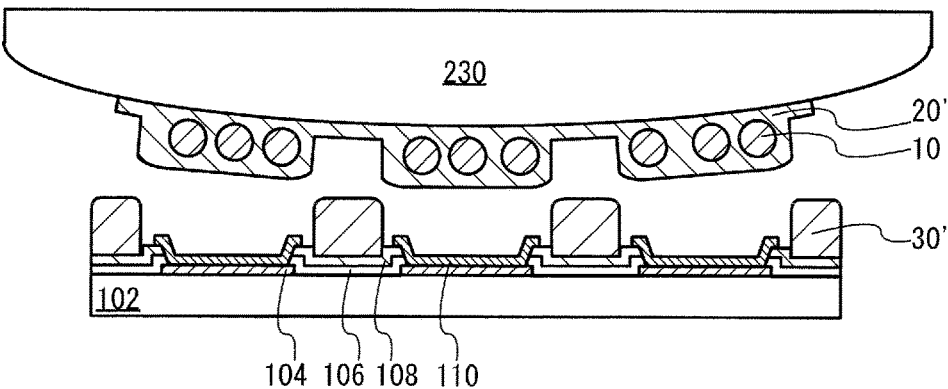
Figure 8D:
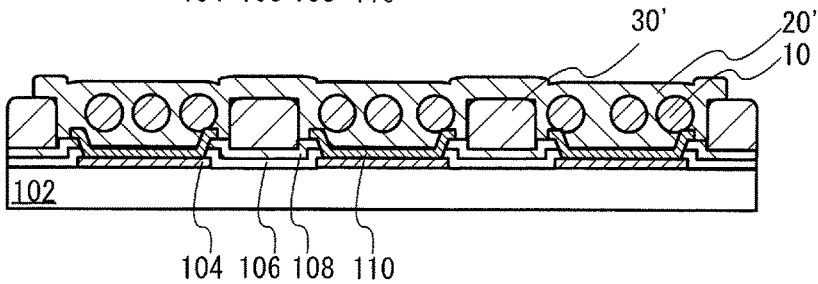

FIG. 8C and FIG. 8D shows the process of transferring the mixture of the plurality of conductive particles 10 and the first composite 20' from the pad 230 to the first surface of the first member 102 by the pad printing scheme. As shown in FIG. 8C and FIG. 8D, the pad 230 is pushed in a direction substantially perpendicular to the first electrode 110, and is then pulled away in the direction substantially perpendicular to the first electrode 110, thereby transferring the mixture of the conductive particles 10 and the first composite 20' displaced to the pad 230 onto the first surface. Here, the first composite 20' and the conductive particles 10 transferred from the depressed parts 246 of the plate 240 are arranged so as to be in contact with the first electrode 110. That is, the first composite 20' is arranged on the first surface of the first member 102, and the conductive particles 10 are arranged on the upper surface of the first electrode 110.

With the depth of the depressed parts 246, the first composite 20' and the conductive particles 10 transferred from the depressed parts 246 of the plate 240 are thickly arranged in the opposing direction (D1 direction) of the electrodes on the first electrode 110 on the first member 102. On the other hand, without the depth of the depressed parts 246, the first composite 20' transferred from the upper surface 244 of the plate 240 is thinly arranged in the opposing direction (D1 direction) of the electrodes in the region other than the first electrode 110 on the first member 102. However, this is not meant to be restrictive, and the first composite 20' may not be transferred from the upper surface 244 of the plate 240 to the pad 230. The first composite 20' may not be transferred from the pad 230 to the region other than the first electrode 110 of the first surface. Here, the second composite 30' is arranged on the region other than the first electrode 110 of the first surface. Thus, the first composite 20' transferred from the upper surface 244 of the plate 240 is arranged to be superposed so as to be in contact with the second composite 30'. In other word, the first composite 20' and the conductive particles 10 transferred from the depressed parts 246 of the plate 240 are arranged on the region other than the region where the second composite 30' is arranged on the first surface of the first material 102. The first composite 20', the conductive particles 10, and the second composite 30' form a substantially flat configuration on the first surface of the first member 102 by arranging the first composite 20' and the conductive particles 10 on the second composite 30' of the first surface of the first member 102.

The viscosity of the curable resin material of the first composite 20' is in the range between a value equal to or higher than $5 \times 10^3$ cP and a value equal to or lower than $5 \times 10^5$ cP. Thus, the conductive particles 10 mixed into the first composite 20' can be retained on the first electrode 110. The use of this method allows the conductive particles 10 and the first composite 20' to be reliably arranged in a predetermined region on the first electrode 110.

Figure 8E:
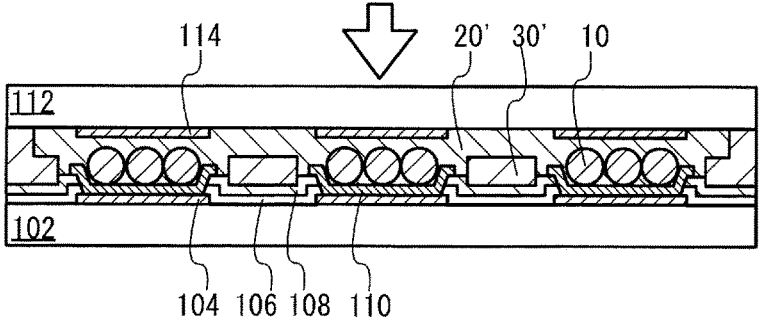

Next, the second electronic component 111 is mounted on the first surface of the first electronic component 101. As shown in FIG. 8E, the first surface of the first member 102 and the second surface of the second member 112 are arranged so as to be opposed to each other so that the corresponding plurality of first electrodes 110 and the plurality of second electrodes 114 are opposed to each other. The first member 102 and the second member 112 are pressed so that the first surface of the first member 102 and the second surface of the second member 112 are pushed in directions substantially perpendicular to the respective surfaces. The first surface of the first member 102 and the second surface of the second member 112 are pressure-welded to the conductive particles 10, the first composite 20', and the second composite 30'. Here, the first composite 20' arranged on the first electrode 110 has a viscosity higher than that of the second composite 30', and is thus retained on the first electrode 110 together with the conductive particles 10. The conductive particles 10 and the first composite 20' arranged on the first electrode 110 are arranged so as to be in contact with the second electrode 114, and the first composite 20' arranged on the region other than the first electrode 110 of the first surface is arranged so as to be in contact with the region other than the second electrode 114 on the second surface.

Figure 8F:
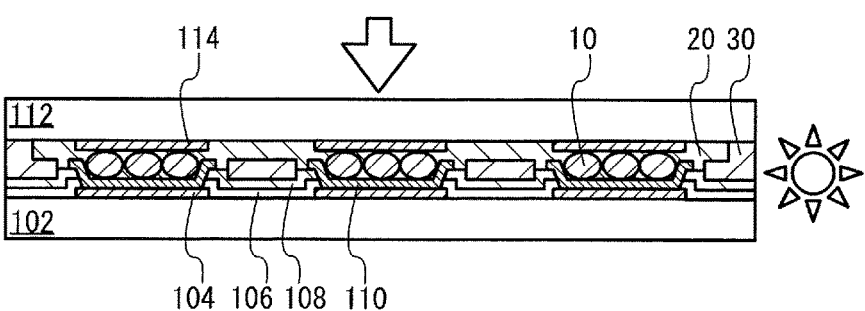

As shown in FIG. 8F, the first member 102 and the second member 112 are further pressed to push the first surface of the first member 102 and the second surface of the second member 112 in the directions substantially perpendicular to the respective surfaces. Here, a sufficient pressure is applied to cause the opposing first electrode 110 and second electrode 114 to be in contact with upper and lower sides of one conductive particle 10. The pressure to push the first surface of the first member 102 and the second surface of the second member 112 can be adjusted as appropriate by a repulsive force of the conductive particles 10 and elastic forces of the first composite 20' and the second composite 30'. This configuration allows electrical connection between the first electrode 110 and the second electrode 114.

With the first member 102 and the second member 112 pressed, the connection structure 100 is irradiated with light to cure the first composite 20' and the second composite 30'. A method of curing the first composite 20' and the second composite 30' is the same as that of the method for manufacturing connection structure according to the first embodiment, and is therefore not described herein. By curing the first composite 20' and the second composite 30', the first resin 20 and the second resin 30 are formed. This configuration allows physical connection between the first surface of the first electronic component 101 and the second surface of the second electronic component 111.

According to the present embodiment, a connection structure and a method for manufacturing connection structure can be provided that can ensure conductivity between the opposing electrodes with a simple process and can reduce a short circuit between adjacent connection electrodes, even if the electrodes arranged on the electronic component have high fineness and high density. Furthermore, since no heat curing connection scheme is used, the electrodes of the upper and lower substrates having different coefficients of thermal expansion can be connected with high accuracy.

Fourth Embodiment

The configuration of a connection structure according to a fourth embodiment is the same as the configuration of the connection structure according to the third embodiment. A method for manufacturing connection structure according to the present embodiment is the same as the method for manufacturing connection structure according to the first embodiment except that the second composite 30' is arranged in a region other than the first electrode 110 of the first member 102 and the plurality of conductive particles 10 and the first composite 20' are arranged on the second electrode 114 of the second member 112. The same description as that of the first embodiment is omitted, and parts different from the methods for manufacturing connection structures according to the first embodiment are described herein.

The Method for Manufacturing Connection Structure

The method for manufacturing connection structure according to one embodiment of the present invention is described by using FIG. 9A to FIG. 9F. Since the existing first electronic component 101 and second electronic component 111 can be used in the present embodiment, their description is omitted. In FIG. 9A to FIG. 9F, the method of forming the connection structure 100a is described in detail.

Figure 9A:
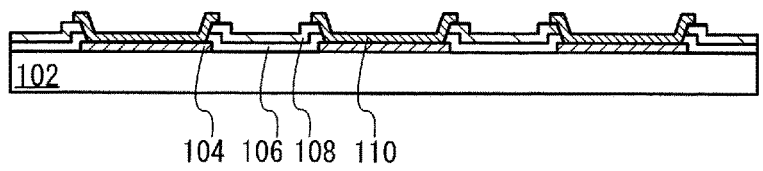
FIG. 9A to FIG. 9F shows a method for producing the connection structure according to an embodiment of the present invention.
Figure 9B:
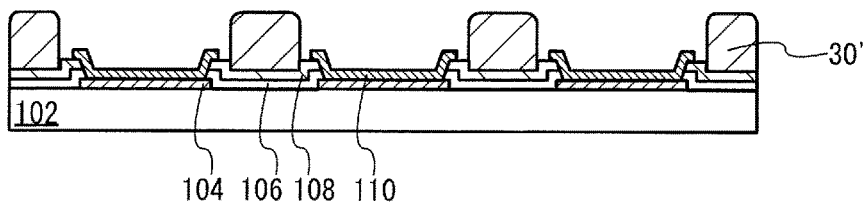

First, the second composite 30' is arranged on the first surface of the first member 102. As shown in FIG. 9A and FIG. 9B, the second composite 30' is arranged in a region other than the first electrode 110 on the first surface of the first member 102. In other words, the second composite 30' is arranged on the first surface of the first member 102 in a region corresponding to the region other than the region where the plurality of conductive particles 10 and the first composite 20' are arranged. Although not shown, in the present embodiment, the second composite 30' is arranged by using a pad printing scheme. However, the method of arranging the second composite 30' is not limited to this scheme, and any existing method capable of different coating in a region other than the region where the plurality of conductive particles 10 and the first composite 20' are arranged can be used. For example, coating by inkjet or a dispenser, screen printing, or the like can be used.

The viscosity of the second composite 30' is in a range between a value equal to or higher than $2 \times 10^3$ cP and a value equal to or lower than $2 \times 10^5$ cP. This allows a flow of the second composite 30' to be inhibited.

Next, the first composite 20' is arranged on the second surface of the second member 112, and the plurality of conductive particles 10 are arranged on the upper surface of the second electrode 114. The plurality of conductive particles 10 and the first composite 20' are mixed, and are arranged by using an offset printing scheme. Since the mixture of the conductive particles 10 and the first composite 20' contains the conductive particles 10, a pad printing scheme of transferring a printed matter by using a pad is particularly preferable. The region and method for arranging the mixture of the plurality of conductive particles 10 and the first composite 20' are the same as those of the method for manufacturing connection structure according to the first embodiment, and therefore are not described herein.

Figure 9C:
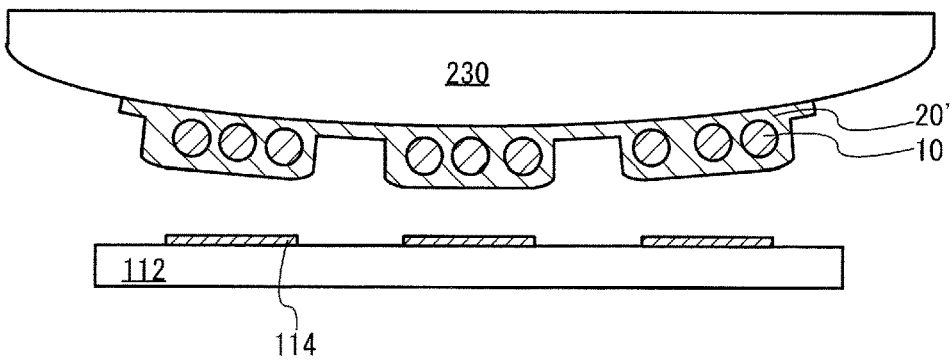
Figure 9D:
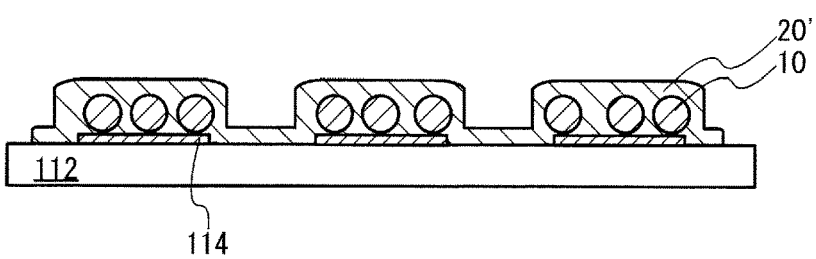

FIG. 9C and FIG. 9D shows the process of transferring the mixture of the plurality of conductive particles 10 and the first composite 20' from the pad 230 to the second surface of the second member 112 by the pad printing scheme. As shown in FIG. 9C and FIG. 9D, the pad 230 is pushed in a direction substantially perpendicular to the second electrode 114, and is then pulled away in the direction substantially perpendicular to the second electrode 114, thereby transferring the mixture of the conductive particles 10 and the first composite 20' displaced to the pad 230 onto the second surface. Here, the first composite 20' and the conductive particles 10 transferred from the depressed parts 246 of the plate 240 are arranged so as to be in contact with the second electrode 114. That is, the first composite 20' is arranged on the second surface of the second member 112, and the conductive particles 10 are arranged on the upper surface of the second electrode 114. The viscosity of the curable resin material of the first composite 20' is in the range between a value equal to or higher than $5 \times 10^3$ cP and a value equal to or lower than $5 \times 10^5$ cP. Thus, the conductive particles 10 mixed into the first composite 20' can be retained on the second electrode 114. The use of this method allows the conductive particles 10 and the first composite 20' to be reliably arranged in a predetermined region on the second electrode 114.

With the depth of the depressed parts 246, the first composite 20' and the conductive particles 10 transferred from the depressed parts 246 of the plate 240 are thickly arranged in the opposing direction (D1 direction) of the electrodes on the second electrode 114 on the second member 112. On the other hand, without the depth of the depressed parts 246, the first composite 20' transferred from the upper surface 244 of the plate 240 is thinly arranged in the opposing direction (D1 direction) of the electrodes in the region other than the second electrode 114 on the second member 112. However, this is not meant to be restrictive, and the first composite 20' may not be transferred from the upper surface 244 of the plate 240 to the pad 230. The first composite 20' may not be transferred from the pad 230 to the region other than the second electrode 114 of the second surface. On the second surface of the second member 112, the first composite 20' forms a convex/concave configuration in the opposing direction (D1 direction) of the electrodes. On the second surface of the second member 112, the conductive particles 10 form a convex configuration together with the first composite 20'.

Figure 9E:
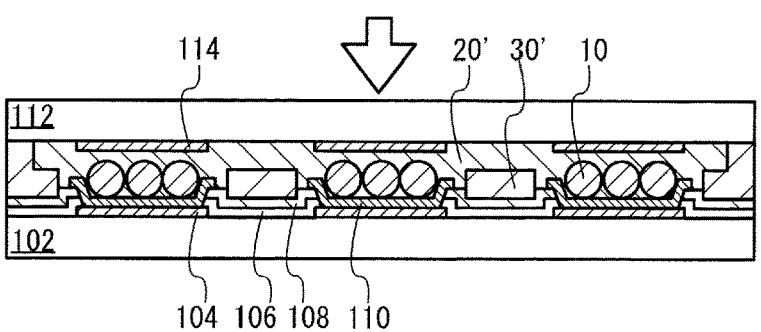

Next, the second electronic component 111 is mounted on the first surface of the first electronic component 101. As shown in FIG. 9E, the first surface of the first member 102 and the second surface of the second member 112 are arranged so as to be opposed to each other so that the corresponding plurality of first electrodes 110 and the plurality of second electrodes 114 are opposed to each other. The first member 102 and the second member 112 are pressed so that the first surface of the first member 102 and the second surface of the second member 112 are pushed in directions substantially perpendicular to the respective surfaces. The first surface of the first member 102 and the second surface of the second member 112 are pressure-welded to the conductive particles 10, the first composite 20', and the second composite 30'. Here, the first composite 20' arranged on the second electrodes 114 has a viscosity higher than that of the second composite 30', and is thus retained on the second electrodes 114 together with the conductive particles 10. The conductive particles 10 and the first composite 20' arranged on the second electrode 114 are arranged so as to be in contact with the first electrode 110, and the second composite 30' arranged in the region other than the first electrode 110 of the first surface is arranged so as to be in contact with the first composite 20' arranged on the region other than the second electrode 114 of the second surface. The first composite 20' and the conductive particles 10 forming the convex/concave configuration on the second surface of the second member 112 are buried by the second composite 30' arranged on the first surface of the first member 102. That is, a space between the first surface of the first member 102 and the second surface of the second member 112 is filled by the first composite 20', the conductive particles 10, and the second composite 30'. In other words, the plurality of conductive particles 10 and the first composite 20' (convex configuration) arranged on the second surface of the second member 112 are arranged on the first surface of the first member 102 in a region other than the region where the second composite 30' is arranged. The first composite 20' arranged on the second surface of the second member 112 (concave configuration) is arranged on the first surface of the first member 102 and a region where the second composite 30' is arranged.

Figure 9F:
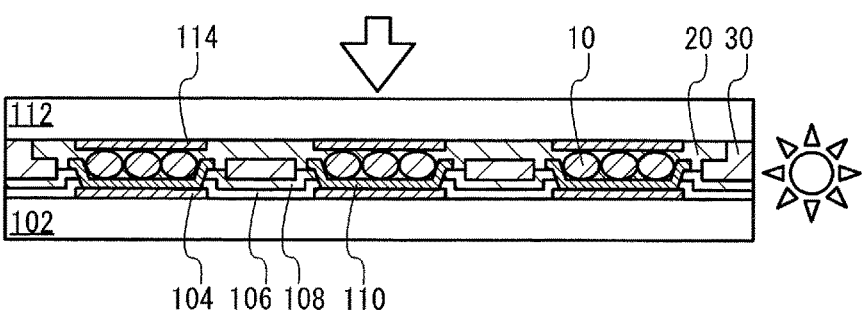

As shown in FIG. 9F, the first member 102 and the second member 112 are further pressed to push the first surface of the first member 102 and the second surface of the second member 112 in the directions substantially perpendicular to the respective surfaces. Here, a sufficient pressure is applied to cause the opposing first electrode 110 and second electrode 114 to be in contact with upper and lower sides of one conductive particle 10. The pressure to push the first surface of the first member 102 and the second surface of the second member 112 can be adjusted as appropriate by a repulsive force of the conductive particles 10 and elastic forces of the first composite 20' and the second composite 30'. This configuration allows electrical connection between the first electrode 110 and the second electrode 114.

With the first member 102 and the second member 112 pressed, the connection structure 100 is irradiated with light to cure the first composite 20' and the second composite 30'. A method of curing the first composite 20' and the second composite 30' is the same as that of the method for manufacturing connection structure according to the first embodiment, and is therefore not described herein. By curing the first composite 20' and the second composite 30', the first resin 20 and the second resin 30 are formed. This configuration allows physical connection between the first surface of the first electronic component 101 and the second surface of the second electronic component 111.

According to the present embodiment, a connection structure and a method for manufacturing connection structure can be provided that can ensure conductivity between the opposing electrodes with a simple process and can reduce a short circuit between adjacent connection electrodes, even if the electrodes arranged on the electronic component have high fineness and high density. Furthermore, since no heat curing connection scheme is used, the electrodes of the upper and lower substrates having different coefficients of thermal expansion can be connected with high accuracy.

The present invention is not limited to the above-described embodiments, and can be modified as appropriate in a range not deviating from the gist of the invention. Also, the embodiments can be combined as appropriate.

First Example

FIG. 10A and FIG. 10B show an example of a connection structure according to one example of the present invention. FIG. 10A is a diagram of an arrangement pattern of the conductive particles 10 and the first resin 20 of a connection structure according to a first example of the present invention. FIG. 10B is a diagram of an arrangement pattern of the first resin 20 and the second resin 30 of the connection structure according to the first example of the present invention. Parameters of the connection structure of the first example are as follows.

Width (short side) (A1) of the first electrode 110=9 µm
Distance (B1) between the first electrodes 110=6 µm
Pitch (A1+B1=C1) of the first electrode 110=15 µm
Length (long side) (D1) of the first electrode 110=105 µm
Area (A1×D1) of the first electrode 110=945 µm$^2$
Number of conductive particles 10 arranged per electrode=19

Second Example

FIG. 11A and FIG. 11B show an example of a connection structure according to one example of the present invention. FIG. 11A is a diagram of an arrangement pattern of the conductive particles 10 and the first resin 20 of a connection structure according to a second example of the present invention. FIG. 11B is a diagram of an arrangement pattern of the first resin 20 and the second resin 30 of the connection structure according to the second example of the present invention. Parameters of the connection structure of the second example are as follows.

Width (short side) (A2) of the first electrode 110=9 µm
Distance (B2) between the first electrodes 110=6 µm
Pitch (A2+B2=C2) of the first electrode 110=15 µm
Length (long side) (D2) of the first electrode 110=105 µm
Area (A2×D2) of the first electrode 110=945 µm$^2$
Number of conductive particles 10 arranged per electrode=26

Third Example

Figure 12A:
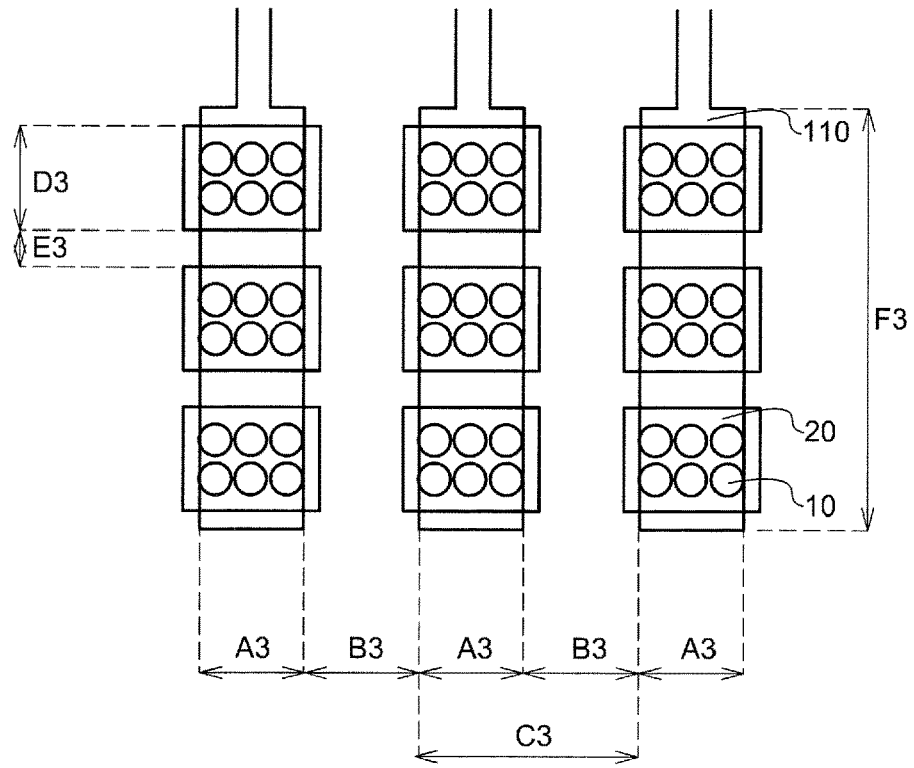
FIG. 12A and FIG. 12B shows an example of the connection structure according to an embodiment of the present invention; and FIG. 13A
Figure 12B:
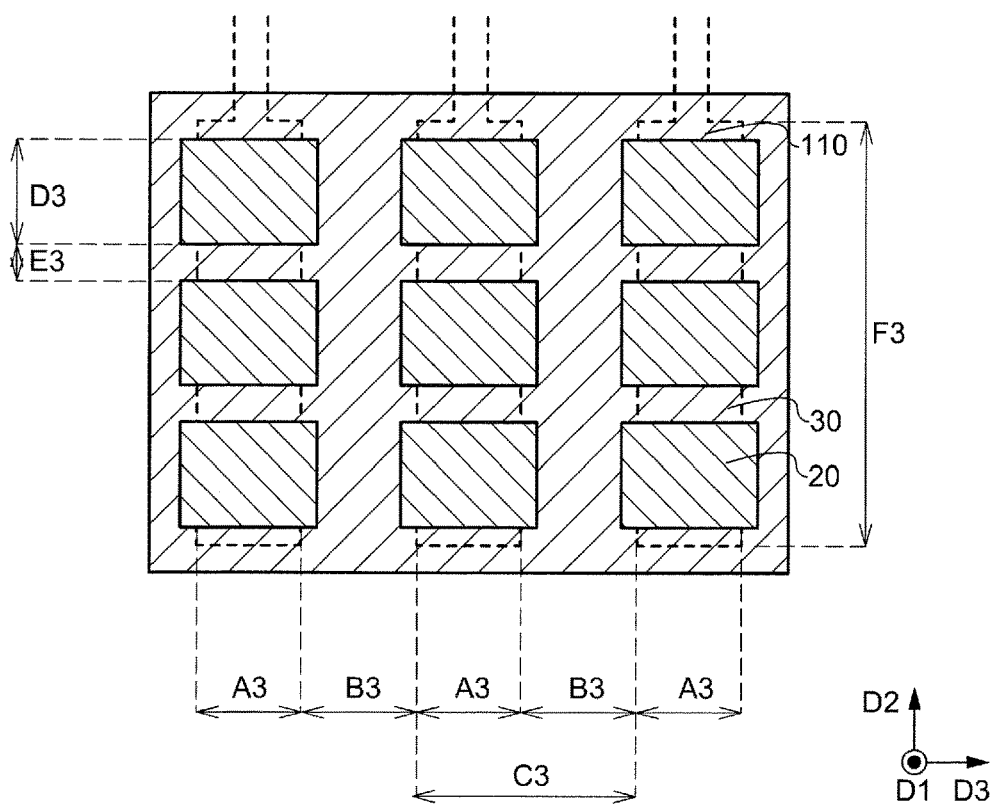

FIG. 12A and FIG. 12B show an example of a connection structure according to one example of the present invention. FIG. 12A is a diagram of an arrangement pattern of the conductive particles 10 and the first resin 20 of a connection structure according to a third example of the present invention. FIG. 12B is a diagram of an arrangement pattern of the first resin 20 and the second resin 30 of the connection structure according to the third example of the present invention. Parameters of the connection structure of the third example are as follows.

Width (short side) (A3) of the first electrode 110=10 µm
Distance (B3) between the first electrodes 110=18 µm
Pitch (A3+B3=C3) of the first electrode 110=28 µm
Length (D3) of one region where the conductive particles 10 and the first resin 20 are arranged=10 µm
Distance (E3) between the region where the conductive particles 10 and the first resin 20 are arranged=7 µm
Length (long side) (F3) of the first electrode 110=44 µm
Area (A3×F3) of the first electrode 110=440 µm$^2$
Area of one region where the conductive particles 10 and the first resin 20 are arranged=100 µm$^2$
Number of regions where the conductive particles 10 and the first resin 20 are arranged per electrode=3
Total area of regions where the conductive particles 10 and the first resin 20 are arranged per electrode=300 µm$^2$
Number of conductive particles 10 arranged per region where the conductive particles 10 and the first resin 20 are arranged=6
Number of conductive particles 10 arranged per electrode=18

Fourth Example

Figure 13A:
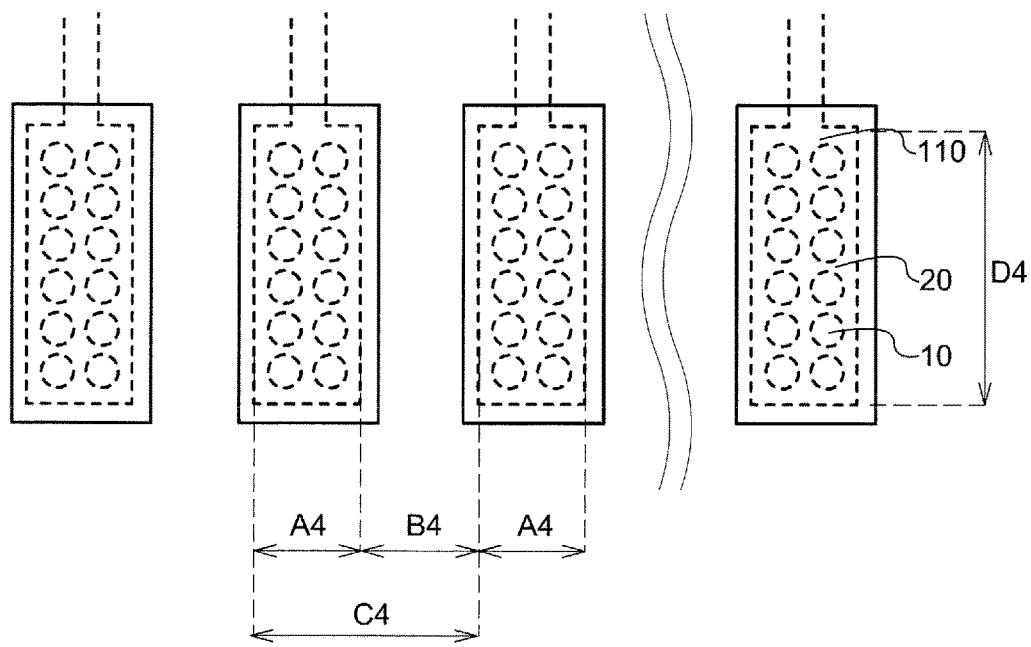
FIG. 13B shows an example of the connection structure according to an embodiment of the present invention.
Figure 13B:
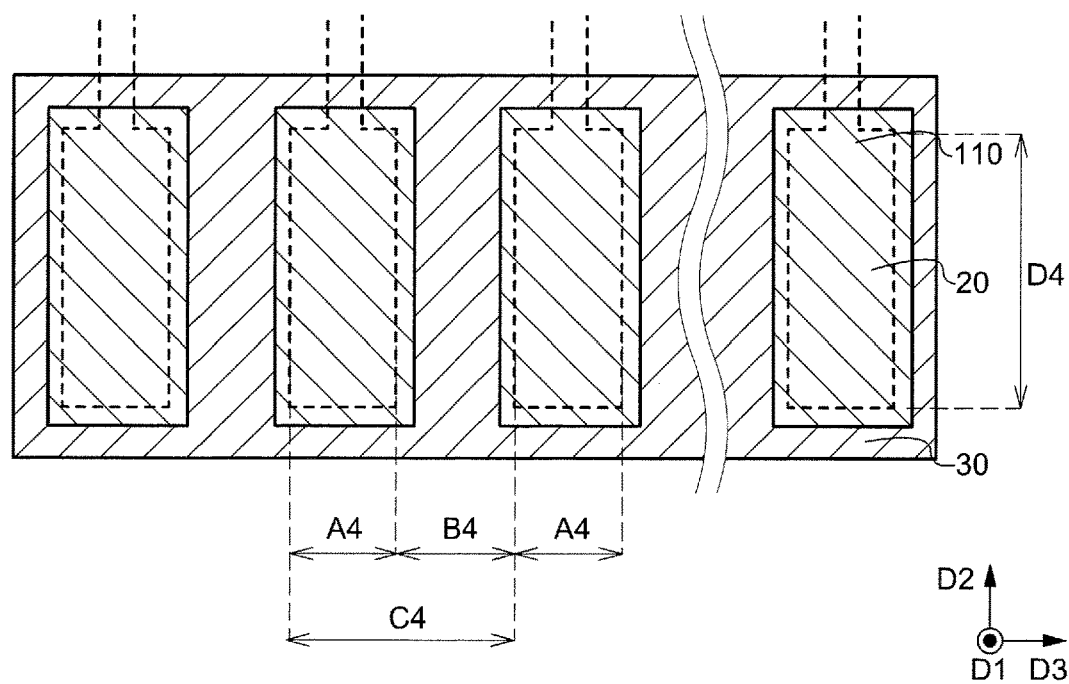

FIG. 13A and FIG. 13B show an example of a connection structure according to one example of the present invention. FIG. 13A is a diagram of an arrangement pattern of the conductive particles 10 and the first resin 20 of a connection structure according to a fourth example of the present invention. FIG. 13B is a diagram of an arrangement pattern of the first resin 20 and the second resin 30 of the connection structure according to the fourth example of the present invention. Parameters of the connection structure of the fourth example are as follows.

Width (short side) (A4) of the first electrode 110=8 µm
Distance (B4) between the first electrodes 110=9 µm
Pitch (A4+B4=C4) of the first electrode 110=17 µm
Length (long side) (D4) of the first electrode 110=40 µm
Area (A4×D4) of the first electrode 110=320 µmt
Number of conductive particles 10 arranged per first electrode 110=12

As shown in the first to sixth examples, according to one embodiment of the present invention, even if the electrodes arranged on the electronic components have high fineness and high density, conductivity between opposing electrodes is ensured with simple process, and a short circuit between adjacent electrodes can be reduced.

What is claimed is:
1. A connection structure comprising:
a first member having a first surface;
a plurality of first electrodes located on the first surface;
a second member having a second surface opposed to the first surface;
a plurality of second electrodes opposed to the plurality of first electrodes and located on the second surface;
a plurality of conductive particles in a first region between at least one of the plurality of first electrodes and at least one of the plurality of second electrodes facing the at least one of the first electrodes, wherein a number density of the plurality of conductive particles in the first region is between 7 and 20 per 400 µm$^2$, and each of the plurality of conductive particles includes a particle core having elasticity coated with metals;
a first resin arranged between the first surface and the second surface, a thickness of the first resin in a second region adjacent to the first region is thinner than a thickness of the first resin in the first region;
a second resin arranged in the second region; and
an insulating film arranged in the second region, wherein the first resin is in contact with the insulating film, the second resin is in contact with the second surface, and a composition of the first resin and a composition of the second resin are different.

2. The connection structure according to claim 1, further comprising
a plurality of terminals, each of the plurality of terminals arranged between the first surface and one of the plurality of first electrodes, and electrically connected to the one of the plurality of first electrodes.

3. The connection structure according to claim 1, wherein
the second resin is further arranged in the first region, a thickness of the second resin in the first region is thinner than a thickness of the second resin in the second first region,
the first resin is in contact with the plurality of first electrodes, and
the second resin is in contact with the plurality of second electrodes.

4. The connection structure according to claim 1, wherein at least one of the plurality of conductive particles is in contact with the at least one of the plurality of first electrodes and the at least one of the plurality of second electrodes.

5. The connection structure according to claim 4, wherein at least one of the plurality of conductive particles is deformed.

6. The connection structure according to claim 1, wherein the plurality of electrodes is arranged at a pitch of 28 μm.

7. The connection structure according to claim 1, wherein the second resin contains a dendrimer or hyperbranch polymer structure portion having an acryl group.

8. The connection structure according to claim 1, wherein the second resin contains an ene/thiol-based curable resin containing an ethylene unsaturated compound and a thiol compound, and a curable component of at least one of the ethylene unsaturated compound and the thiol compound is a 9,9-bisarylfluorene compound.

9. A connection structure comprising:
a first member having a first surface;
at least one first electrode located on the first surface;
a second member having a second surface opposed to the first surface;
at least one second electrode opposed to the at least one first electrode and located on the second surface;
a plurality of conductive particles arranged in at least one first region between the at least one first electrode and the at least one second electrode, wherein a number density of the plurality of conductive particles in the at least one first region is between 7 and 20 per 400 μm², and each of the plurality of conductive particles includes a particle core having elasticity coated with metals;
a first resin arranged between the first surface and the second surface, a thickness of the first resin in a second region surrounding the at least one first region between the first surface and the second surface is thinner than a thickness of the first resin in the at least one first region; and
a second resin arranged in the second region,
wherein the at least one first electrode overlaps the at least one first region and the second region,
the second resin is in contact with the at least one second electrode between the at least one first electrode and the at least one second electrode in the second region, and
a composition of the first resin and a composition of the second resin are different.

10. The connection structure according to claim 9, wherein the first resin is in contact with the at least one first electrode and the at least one second electrode in the at least one first region.

11. The connection structure according to claim 9, wherein
the second resin is arranged in the at least one first region, a thickness of the second resin in the at least one first region is thinner than a thickness of the second resin in the second region,
the first resin is in contact with the at least one first electrode, and
the second resin is in contact with the at least one second electrode.

12. The connection structure according to claim 9, wherein
the plurality of conductive particles is arranged in the at least one first region in a range of seven or less.

13. The connection structure according to claim 9, wherein
the at least one first region includes a plurality of first regions, and
the plurality of first regions is separated from each other by 5 μm or more.

14. The connection structure according to claim 9, wherein
the plurality of conductive particles are i-s-arranged only in the first region, and
the plurality of conductive particles include the particle core with a highly-hard resin material coated with a rubber-like elastic resin or the particle core with a highly-hard inorganic material coated with a rubber-like inorganic elastic body.

15. The connection structure according to claim 9, wherein
the plurality of conductive particles is in contact with the at least one first electrode and the at least one second electrode.

16. The connection structure according to claim 9, wherein
the plurality of conductive particles is deformed.

17. The connection structure according to claim 9, wherein
the at least one first electrode includes a plurality of first electrodes, and
an insulating film is arranged in a third region adjacent the at least one of the plurality first electrodes.

18. The connection structure according to claim 9, wherein
the first resin is in contact with the insulating film in the second region.

19. The connection structure according to claim 1, wherein
the plurality of conductive particles are arranged only in the first region, and
the plurality of conductive particles include the particle core with a highly-hard resin material coated with a rubber-like elastic resin or the particle core with a highly-hard inorganic material coated with a rubber-like inorganic elastic body.

* * * * *